(12) United States Patent
Kamikawa et al.

(10) Patent No.: US 6,589,359 B2
(45) Date of Patent: Jul. 8, 2003

(54) CLEANING METHOD AND CLEANING APPARATUS FOR SUBSTRATE

(75) Inventors: Yuji Kamikawa, Tosu (JP); Hiroshi Tanaka, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 99 days.

(21) Appl. No.: 09/927,447

(22) Filed: Jul. 10, 2001

(65) Prior Publication Data
US 2002/0053355 A1 May 9, 2002

(30) Foreign Application Priority Data

Jul. 11, 2000 (JP) .......................... 2000-210082
Jul. 13, 2000 (JP) .......................... 2000-212258

(51) Int. Cl.[7] .............................................. B08B 3/00
(52) U.S. Cl. .................. 134/26; 134/2; 134/30; 134/34; 134/33; 134/42; 134/902; 134/95.1; 134/95.3; 134/102.1; 134/137; 134/153; 134/198; 34/443; 34/448; 34/467; 438/906
(58) Field of Search ................. 134/2, 26, 30, 134/33, 34, 42, 902, 137, 198, 153, 95.1, 95.3, 102.1; 34/443, 448, 467; 438/906

(56) References Cited

U.S. PATENT DOCUMENTS 5,336,371 A  *  8/1994  Chung et al. .................. 134/34

5,451,291 A  *  9/1995  Park et al. .................. 438/702

FOREIGN PATENT DOCUMENTS

GB          2325782       * 12/1998
JP          4-291726      * 10/1992

* cited by examiner

Primary Examiner—Randy Gulakowski
Assistant Examiner—M. Kornakov
(74) Attorney, Agent, or Firm—Smith, Gambrell & Russell, LLP

(57) ABSTRACT

A cleaning method is provided for cleaning a semiconductor wafer. In this method, after removing adhering substances from the wafer by using a chemical liquid of organic amine type, there is carried out a pure-water cleaning capable of prevention of electrostatic destruction and alkaline corrosion on the wafer. In detail, it is executed to make a processing chamber have an atmosphere of carbon dioxide and subsequently introduce steam into the chamber to dissolve $CO_2$-gas into the steam. Next, spray the pure water to the wafer. Then, the steam in which $CO_2$-gas is dissolved dissolves in the pure water, so that the pure wafer becomes weak acid, accomplishing the reduction of resistivity of the pure water. Additionally, alkaline substances is neutralized by carbonated water to prevent an alkaline corrosion on a wiring layer on the wafer's surface.

6 Claims, 17 Drawing Sheets

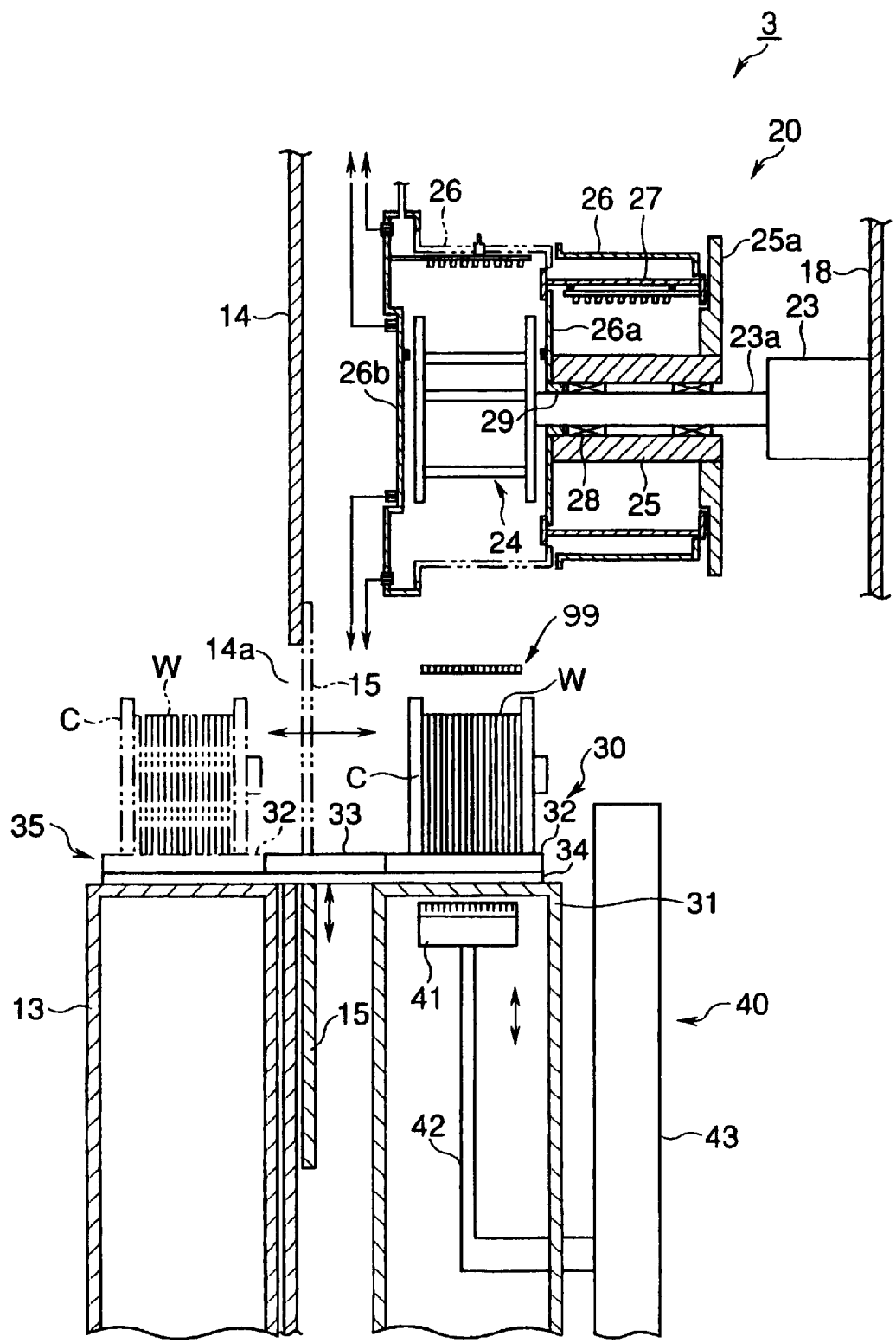
F I G. 3

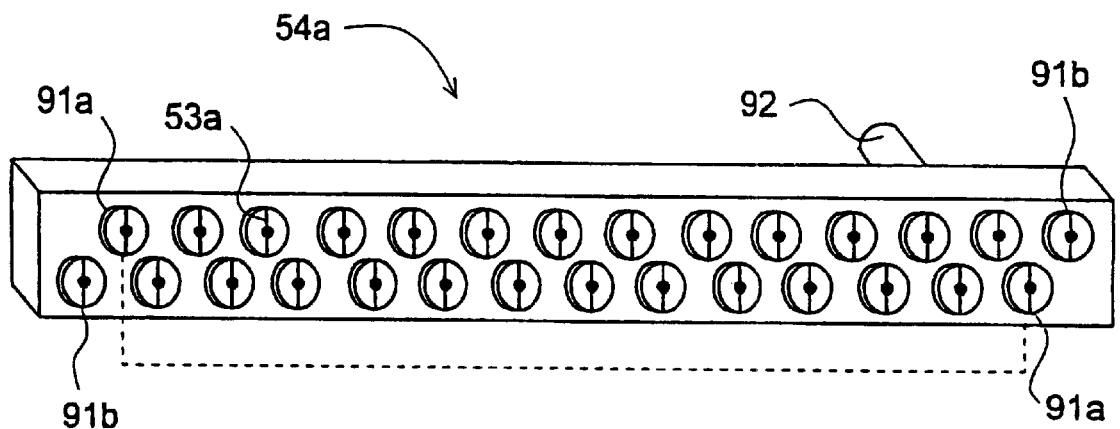
F I G. 6A
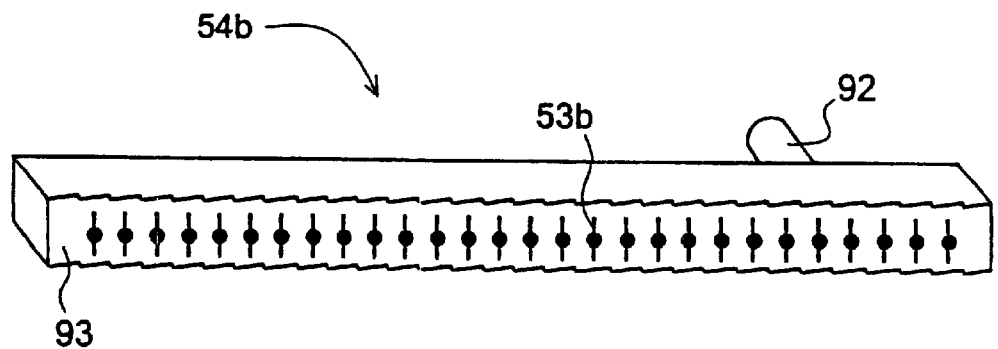
F I G. 6B

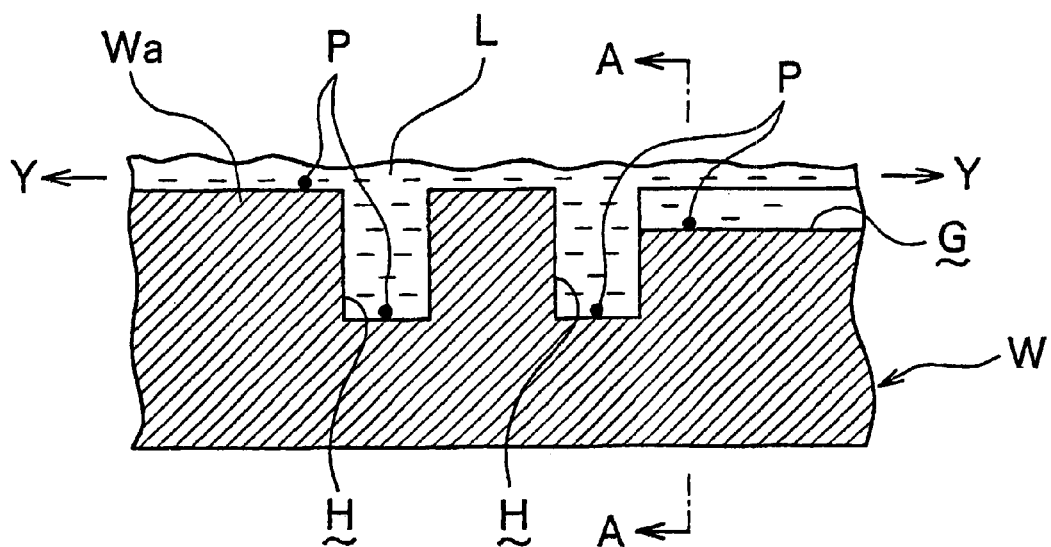
F I G. 13 A
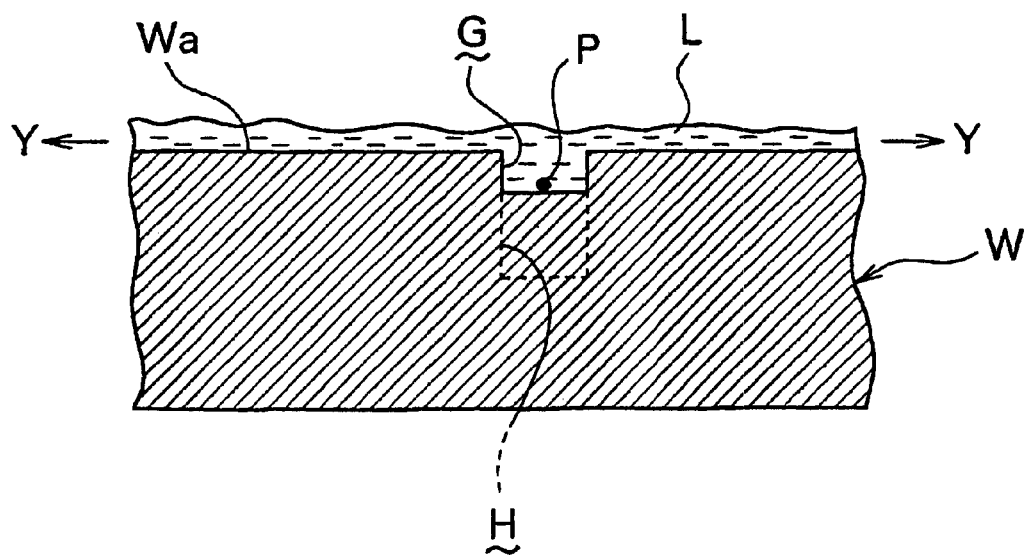
F I G. 13 B

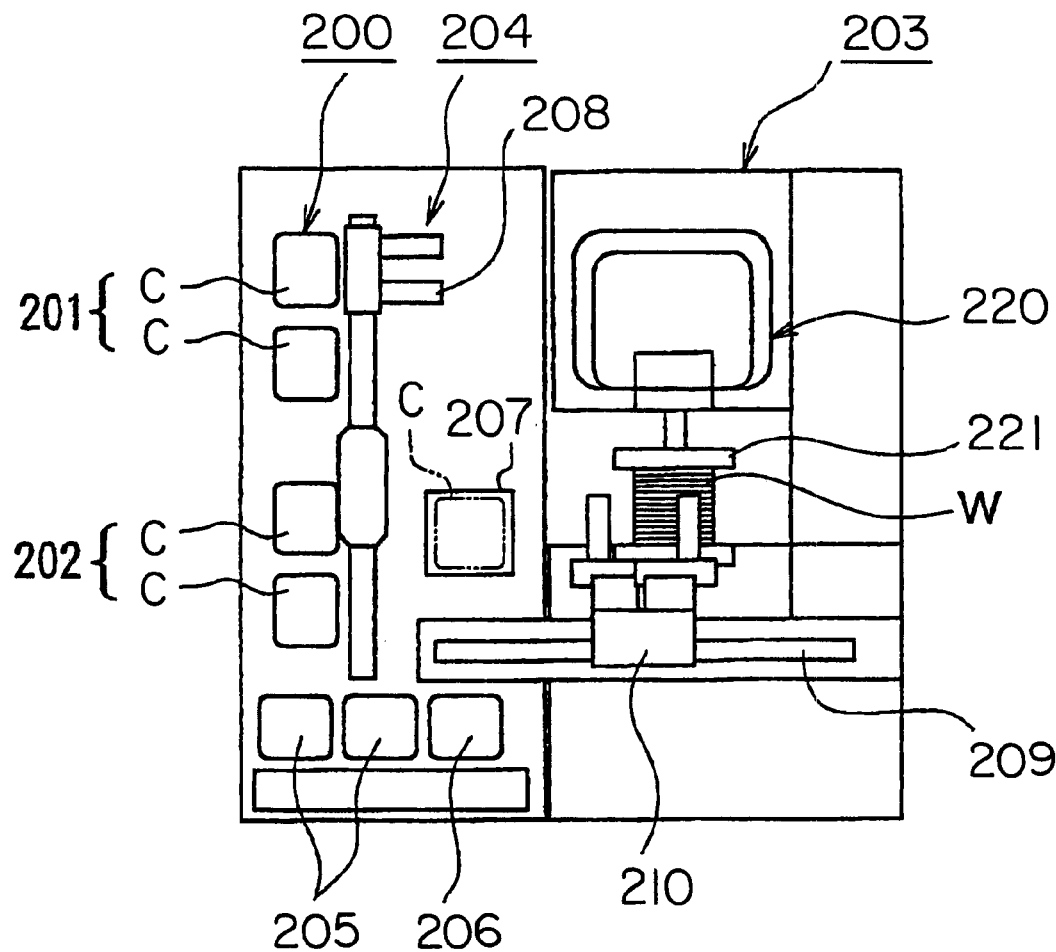
F I G. 14

CLEANING METHOD AND CLEANING APPARATUS FOR SUBSTRATE

BACKGROUND OF THE INVENTION

1. Field of the Invention

The present invention relates to a cleaning method of cleaning substrates of various kinds, such as semiconductor wafers and LCD substrates, by a processing liquid and also relates to a cleaning apparatus for carrying out the above cleaning method.

2. Description of the Related Art

In the manufacturing process of the semiconductor devices, the semiconductor wafers as the substrates are processed by a processing liquid, such as designated chemical liquids and pure water, in order to remove contaminations (e.g. particles, organic contaminants and metallic impurities), organic substances and oxidization films, out of the wafers.

When carrying out this cleaning process by using the pure water, there is used $CO_2$ injection water of which resistivity is lowered by dissolving carbon dioxide ($CO_2$) gas into the pure water, in order to avoid the generation of static electricity during the cleaning process, which might cause discharge breakdown on the wafers.

The $CO_2$ injection water is produced, for example, by allowing carbon dioxide through filters, such as counter-permeable membrane, to dissolve carbon dioxide into the pure water.

During the production of the $CO_2$ injection water, the resistivity of the finished $CO_2$ injection water is always measured and further the so-measured value is fed back for the present dissolution control of carbon dioxide to attain a designated resistivity of the water.

However, when the cleaning apparatus is equipped with such a production unit of the $CO_2$ injection water, there come into existence problems that the installation cost is elevated and the apparatus itself is large-sized, due to the establishment of additions, for example, filters, a resistivity meter, a feedback unit, etc. From this point of view, it is deemed that a more simple and convenient method of allowing the resistivity of pure water to be reduced is desirable to restrict the occurrence of static electricity for prevention the discharge breakdown on the wafers.

Meanwhile, in the cleaning process using various chemical liquids preceding the cleaning step using the pure water, there is a case of using a chemical liquid of organic-amine type. In this particular case, alkaline substances are produced after the cleaning process of the pure water following the cleaning process using the chemical liquid of organic-amine type, due to the reaction of the chemical liquid with the pure water. Unfortunately, the alkaline substances erode aluminum wiring on the wafers. In this view, it is also desired to prevent the generation of alkaline substances derived from the reaction of the chemical liquid with the pure water.

Hereat, it is noted that the manufacturing process of semiconductor wafers comprises the following steps of: forming oxidation layers ($SiO_2$), nitride layers (SiN), metal layers (Cu) or the like on the wafers; applying resists on the wafers; exposing a designated pattern to each resist on the wafers and next developing the resist by developer; dry-etching oxidation layers ($SiO_2$), nitride layers (SiN), metal layers (Cu) or the like; cleaning the wafers by a chemical liquid, such as organic solvent, organic acid, inorganic acid, etc. (for removal of residuals, e.g. polymers); and finally rinsing the used chemical liquid from the wafers, in that order.

As to the method of cleaning the wafers by the chemical liquid, there is a known method of supplying the chemical liquid to the rotating wafers. Here, it should be noted that there exist linear grooves and holes on the wafer surface, which are resulting from the etching step. Since there is a difference between flat potions on the wafer surface and the grooves/holes thereon in respect of the flowing condition of the chemical liquid, it is impossible to remove polymers sticking to the wafer perfectly in the conventional method. For this reason, it requires a long period for the chemical-processing process, causing the reduction of throughput.

SUMMARY OF THE INVENTION

Accordingly, the first object of the present invention is to provide a method for dissolving carbon dioxide in the pure water for cleaning substrates with ease and convenience.

The second object of the present invention is to provide a method for restricting the generation of alkaline substances resulting from the reaction of a chemical liquid of organic-amine type with the pure water in the cleaning process for the substrates.

The third object of the present invention is to provide a method of cleaning a surface of the substrate having grooves and holes formed thereon, effectively.

In order to accomplish the above objectives, the present invention provides a method of cleaning a substrate in a processing chamber, which includes the steps of: (a) introducing carbon dioxide gas into the processing chamber, thereby making an atmosphere of carbon dioxide concentration being greater than that of air in the processing chamber; and (b) spraying the substrate with pure water while rotating the substrate in the processing chamber having the atmosphere of carbon dioxide.

The present invention also provides a substrate cleaning apparatus, which includes: a substrate holder that holds a substrate; a motor that rotates the substrate holder; an enclosure defining a processing chamber therein, the processing chamber being capable of accommodating the substrate holder; a carbon dioxide gas supply system that supplies carbon dioxide gas into the processing chamber; and a pure water supply nozzle that sprays the substrate accommodated in the processing chamber with pure water.

In addition, the present invention also provides a method of cleaning a substrate, which includes the steps of: (a) supplying the substrate with a chemical liquid for dissolving unnecessary substances sticking to the substrate while rotating the substrate at a first rotating speed; (b) supplying the substrate with the chemical liquid while rotating the substrate at a second rotating speed greater than the first rotating speed; and (c) stopping supplying the chemical liquid and rotating the substrate at a third rotating speed greater than the second rotating speed.

Furthermore, the present invention also provides a substrate cleaning apparatus, which includes: a substrate holder that holds a substrate; a motor that rotates the substrate holder; a nozzle that sprays the substrate with a chemical liquid for dissolving unnecessary substances sticking to the substrate; and a controller that controls a rotation of the motor and an ejection of the chemical liquid from the nozzle according to a routine including the steps of: (a) supplying the substrate with the chemical liquid while rotating the substrate at a first rotating speed; (b) supplying the substrate with the chemical liquid while rotating the substrate at a second rotating speed greater than the first rotating speed; and (c) stopping supplying the chemical liquid and rotating the substrate at a third rotating speed greater than the second rotating speed.

BRIEF DESCRIPTION OF THE DRAWINGS

FIG. 3 is a sectional view showing a cleaning unit of the cleaning apparatus of FIG. 1;

FIGS. 6A and 6B are perspective views of ejection nozzles of FIGS. 4 and 5 of the other embodiments;

FIG. 13A is a sectional view showing a contact condition between polymer sticking to the surface of the wafer and the chemical liquid;

FIG. 13B is a sectional view taken along a line A—A of FIG. 13A;

FIG. 14 is a schematic plan view showing the structure of the cleaning apparatus of the third embodiment of the invention;

DESCRIPTION OF THE PREFERRED EMBODIMENTS

With reference to attached drawings, embodiments according to the present invention will be described below.
[1st. Embodiment]

Figure 1:
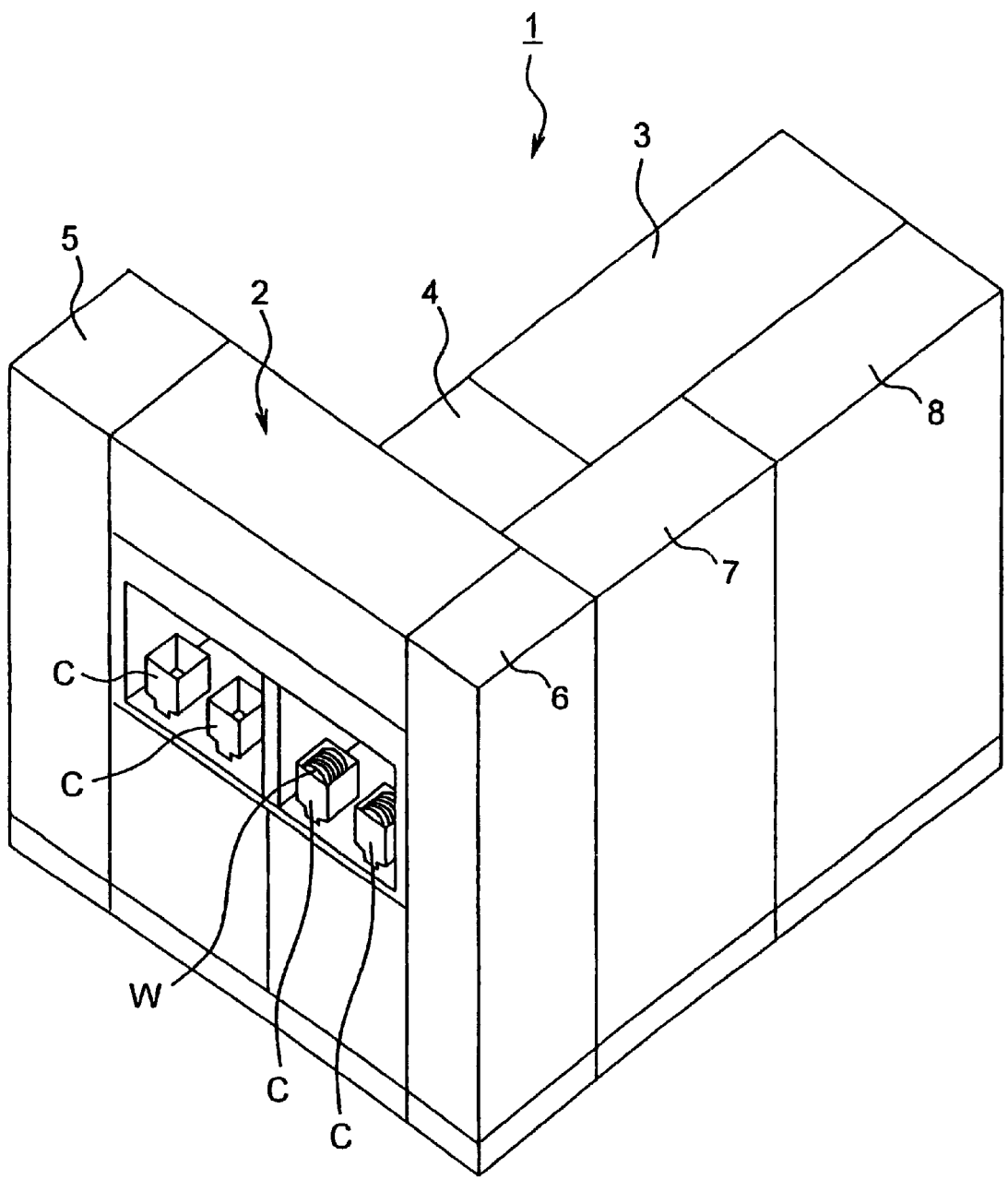
FIG. 1 is a perspective view showing the first embodiment of a cleaning apparatus of the present invention.
Figure 2:
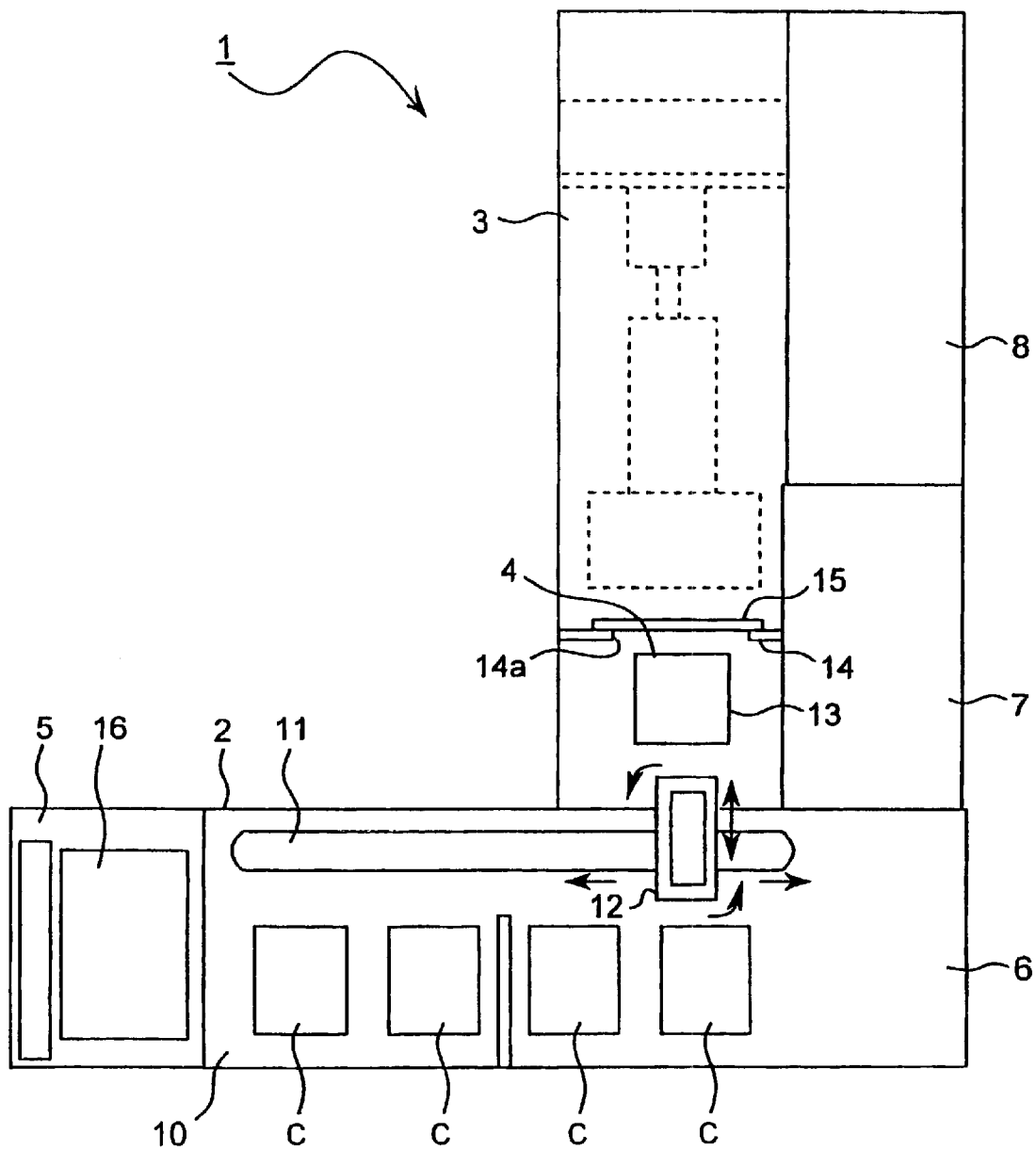
FIG. 2 is a plan view showing the cleaning apparatus of FIG. 1.

The first embodiment will be explained while taking example by a cleaning apparatus for consistently loading, washing, drying and unloading semiconductor wafers in batch. Note, the semiconductor wafers will be referred as "wafers", hereinafter. FIG. 1 is a perspective view of the cleaning apparatus and FIG. 2 is a plan view of the cleaning apparatus. As shown in FIGS. 1 and 2, the cleaning apparatus 1 includes an in/out port (container loading/unloading section) 2 for loading and unloading carriers (substrate container) C capable of accommodating the wafers W therein, a cleaning unit 3 for performing a cleaning process against the wafers W, a stage section 4 disposed between the in/out port 2 and the cleaning unit 3 to load the carriers C into the cleaning unit 3 and also unload the carriers C therefrom, a carrier cleaning unit 5 for cleaning the carriers C and a carrier stocking unit 6 for stocking a plurality of carriers C. Note, reference numeral 7 designates a power unit and reference numeral 8 designates a chemical tank box.

The in/out port 2 is provided with a mount table 10 allowing four carriers C to be mounted thereon and a carrier conveyer mechanism 12 capable of moving along a conveyer path 11 defined along the arrangement direction of the carriers C. The carrier conveyer mechanism 12 shuttles the carrier C between the mount table 10 and the stage section 4. The carrier C is capable of accommodating the wafers W of the plural number, for example, twenty-six wafers W in the vertical arrangement.

The stage section 4 is provided with a stage 13 for mounting the carrier C thereon. The carrier C is transported between the cleaning unit 3 and the stage 13 by a carrier conveyer mechanism having an actuating cylinder. On the stage 13, there is also provided a reverse mechanism (not shown) for reversing the carrier C. The reason why the stage 13 has the reverse mechanism is that, since the carrier conveyer mechanism 12 after receipt of the carrier C from the mount table 10 transfers the carrier C to the stage 13 while rotating its arm (not shown), the direction of the carrier C on the stage 13 is opposite to that of the carrier C on the table 10.

A partition wall 14 is arranged between the stage section 4 and the cleaning unit 3. The partition wall 14 has an opening 14a formed to load/unload the carrier C therethrough. The opening 14a can be closed by a shutter 15. During processing the wafers W in the cleaning unit 3, the shutter 15 is closed. When loading the carrier C into the unit 3 and unloading the carrier C out of the unit 3, the shutter 15 is opened.

The carrier cleaning unit 5 is equipped with a carrier cleaning bath 16. In the carrier cleaning bath 16, the carrier C emptied as a result of taking out the wafers W at the cleaning unit 3 is cleaned.

The purpose of provision of the carrier stocking unit 6 is to make the carrier C having the uncleaned wafers W or the emptied carrier C after taking out the uncleaned wafers W wait for the next-coming process temporarily. Also, the same unit 6 is provided to make the emptied carrier C to wait in advance of accommodating the cleaned wafers W. The interior of the carrier stocking unit 6 is capable of stocking a plurality of carriers C vertically. Further, the carrier stocking unit 6 is provided with a carrier moving mechanism. The carrier moving mechanism capable of placing the carrier C in the carrier stocking unit 6 on the carrier conveyer mechanism 12 and also capable of transferring the carrier C to a designated position in the carrier stocking unit 6.

Figure 4:
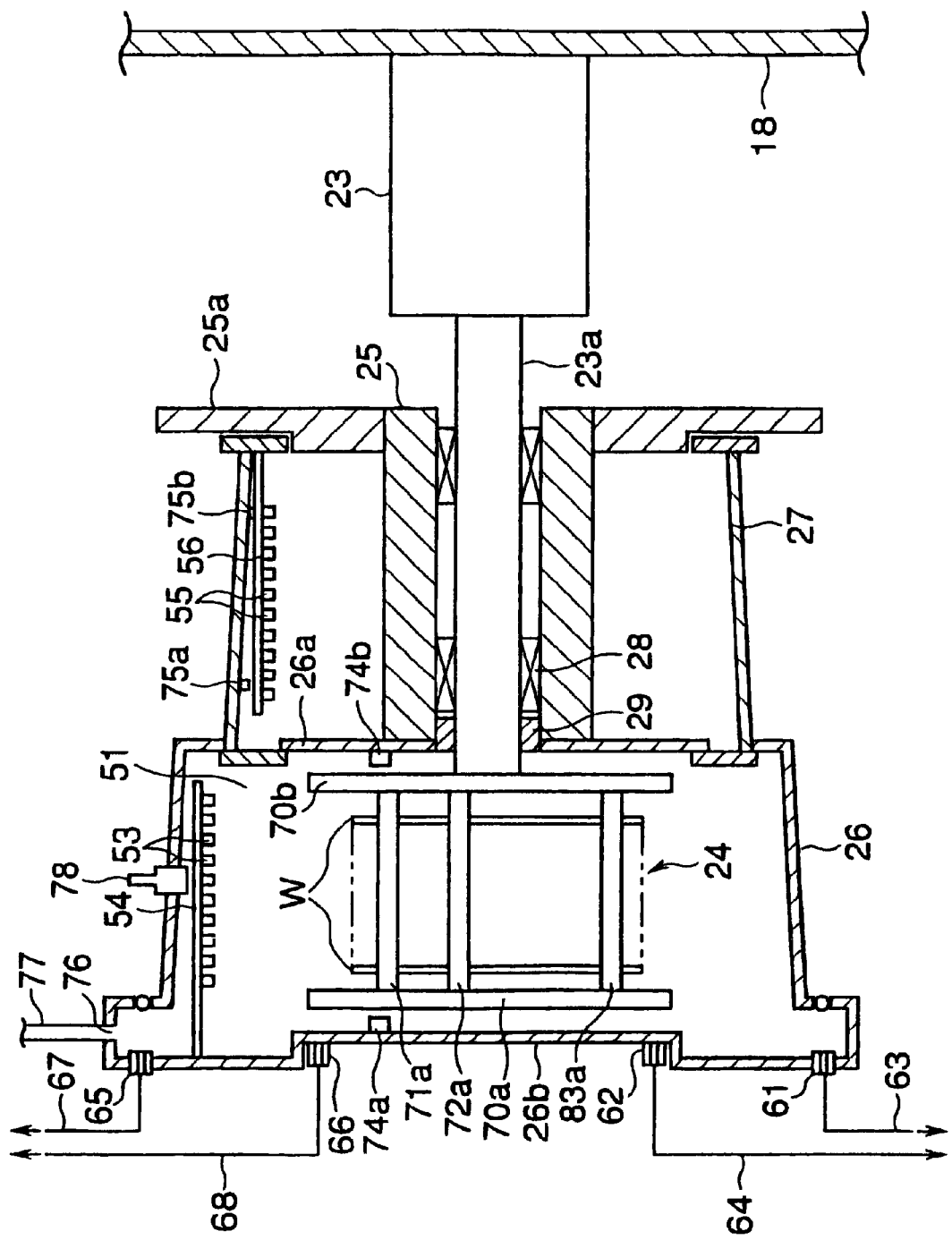
FIG. 4 is a sectional view showing a condition that an inner cylinder is withdrawn from an outer cylinder of the cleaning unit of FIG. 3.
Figure 5:
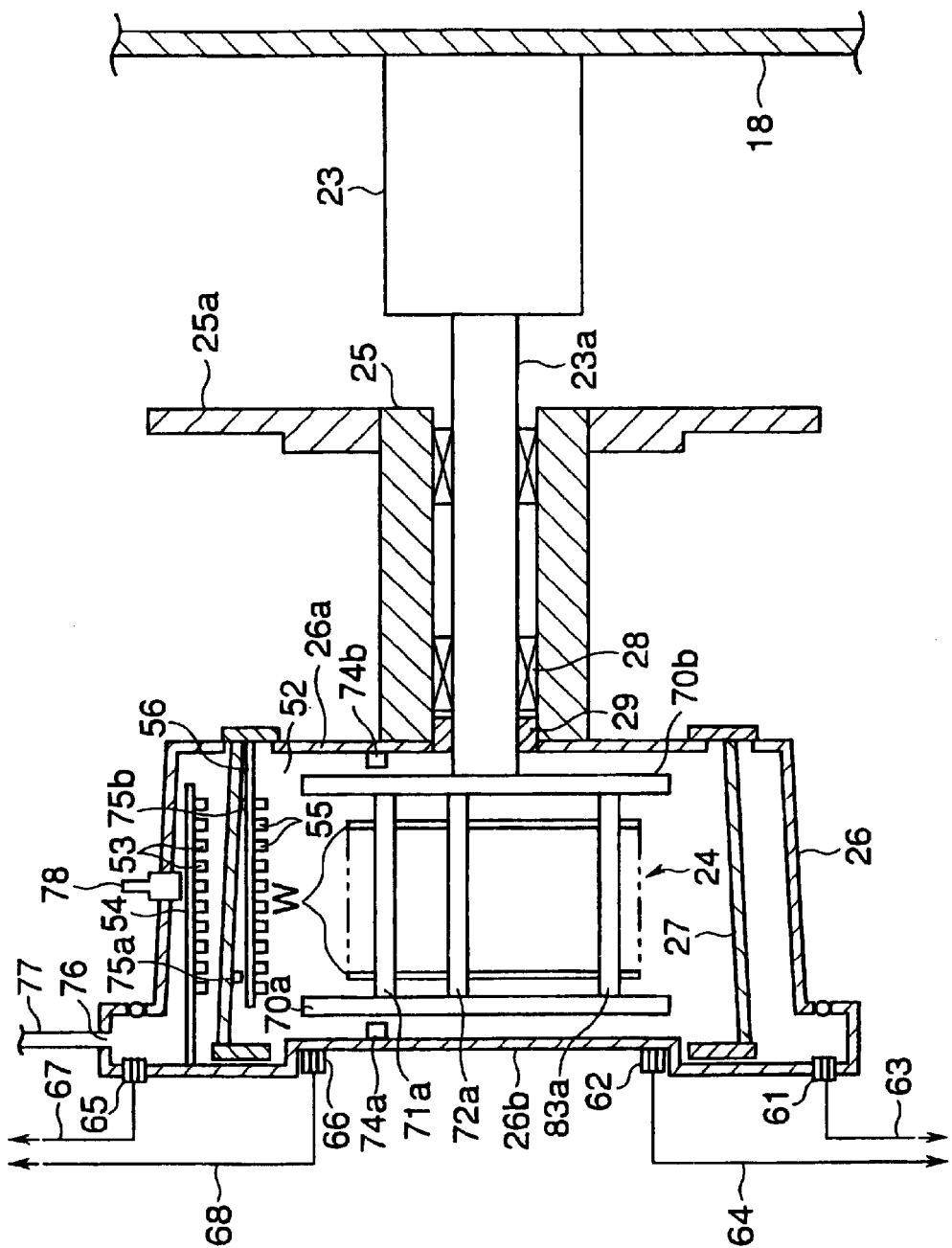
FIG. 5 is a sectional view showing a condition that the inner cylinder is arranged inside the outer cylinder of the cleaning unit of FIG. 3.

Next, the cleaning unit 3 will be described. FIG. 3 is a sectional view showing the interior of the cleaning unit 3. FIGS. 3 and 4 are sectional views both showing a cleaning part of the cleaning unit 3. In detail, FIG. 4 illustrates a condition that an inner cylinder 27 is withdrawn out of an outer cylinder 26. Note, this position of the inner cylinder 27 will be called "retracted position" hereinafter. On the other hand, FIG. 5 illustrates another condition that the inner cylinder 27 is arranged inside the outer cylinder 26. This position of the cylinder 27 will be called "processing position" hereinafter.

Inside the cleaning unit 3, there are arranged, as shown in FIG. 3, a cleaning section 20, a carrier standby (waiting) section 30 and a wafer moving mechanism 40.

The carrier standby section 30 has a stage 31 arranged just below a rotor 24. A carrier conveyer mechanism 35 transfers the carrier C between the stage 13 of the stage section 4 and the stage 31 of the carrier standby section 30. The carrier conveyer mechanism 35 has a base member 34 bridging between the stage 13 and the stage 31, guide rails 33 on the base member 34 and a slidable stage 32 moving between the stage 13 and the stage 31 along the guide rails 33. The carrier c on the slidable stage 32, which has been loaded from the stage section 4 into the carrier standby section 30, stops at a position on the stage 31 and stands ready there.

The wafer moving mechanism 40 has a wafer holding member 41 for holding the wafers W, a supporting rod 42 for supporting the wafer holding member 41 and an elevator unit 43 for moving the wafer holding member 41 up and down through the supporting rod 42. By rising the wafer holding member 41 by the elevator unit 43, the wafers W at the carrier standby section 30 can be transferred between the carrier C at the carrier standby section 30 and the rotor 24 of the cleaning section 20.

For the purposed of holding the wafers W, grooves are formed on the wafer holding member 41 at predetermined intervals. The number of grooves is twice as many as the number of wafers (e.g. fifty-two grooves) that the carrier C can accommodate. These grooves are provided for holding the uncleaned wafers W and the cleaned wafers W alternatively.

A wafer detector 99 is arranged between the cleaning section 20 and the carrier standby section 30, in detail, besides the transfer route of the wafers W where they are transferred between the carrier C on the stage 31 and the rotor 24 by the wafer holding member 41. The wafer detector 99 includes a plurality of optical sensors each consisting of a pair of emitter and receptor interposing the transfer route of the wafers W therebetween. When the wafers W pass through the wafer detector 99, it confirms the number of wafers W and the presence of so-called "jump-slot" condition that at least one wafer is carried in the carrier C inappropriately or dropped from the carrier C.

The cleaning section 20 serves to remove resist-mask, polymer layer as etching residual, etc. from the wafers W after the etching process. Besides the above rotor 24, the cleaning section 20 is provided with a vertical support wall 18 and a motor 23 fixed on the support wall 18. The motor 23 has a horizontal rotating shaft 23a to which a rotor 24 is secured. The rotating shaft 23a is surrounded by a support cylinder 25.

The rotor 24 has a pair of circular plates 70a and 70b. The circular plate 70b is fixed on the rotating shaft 23a of the motor 23. A gap between the circular plates 70a and 70b is bridged by first immovable support rods 71a, 71b (71b: not shown because of back of the rod 71a), and second immovable support rods 72a, 72b (72b: not shown because of back of the rod 71a). The rotor 24 further includes movable (rotatable) support rods 83a, 83b (83b: not shown because of back of the rod 83a). Owing to the provision of these support rods, the rotor 24 is capable of carrying a plurality (e.g. 26 pieces) of wafers W in the vertical arrangement and also in the horizontal direction at regular intervals.

The outer cylinder 26 and the inner cylinder 27 are movably attached to the support cylinder 25 so as to surround the rotor 24 to define a processing chamber in the cylinders. The inner cylinder 27 has a diameter smaller than that of the outer cylinder 27. The outer cylinder 26 is movable between the processing position (shown with chain double-dashed lines of FIG. 3) and the standby position (shown with solid lines of FIG. 3). The inner cylinder 27 is movable between the processing position shown in FIG. 5 and the standby position outside the support cylinder 25 shown in FIGS. 3 and 4.

When loading the wafers W into the rotor 24 or unloading the wafers W therefrom, both of the cylinders 26, 27 are positioned at the standby position, as shown in FIG. 3. As shown in FIG. 4, when the outer cylinder 26 is positioned at the processing position and the inner cylinder 27 is positioned at the standby position, a first processing chamber 51 is defined by the outer cylinder 26, a vertical wall 26a closer to the motor 23 and another vertical wall 26b closer to the leading end of the rotor 24 (see FIG. 4). As shown in FIG. 5, when the inner cylinder 27 (and the outer cylinder 26) are positioned at the processing position, a second processing chamber 52 is defined by the inner cylinder 27 and the vertical walls 26a, 26b.

The vertical wall 26a is attached to the support cylinder 25. A bearing 28 is arranged between the support cylinder 25 and the rotating shaft 23a. The vertical wall 26a and the leading end of the cylinder 25 are sealed up with a labyrinth seal 29 in order to prevent particles of the motor 23 from invading the processing chamber 51. The support cylinder 25 is provided, on its end closer to the motor 23, with an engagement member 25a engageable with the outer cylinder 26 and the inner cylinder 27. Note, the processing chambers 51, 52 provide closed spaces by means of not-shown seal mechanisms.

Attached to the vertical wall 26b are a discharging nozzle 54, which has a number of ejecting orifices 53 juxtaposed in the horizontal direction. The nozzles 54 are capable of ejecting processing liquids (e.g. pure water, IPA, chemical liquids) and various gases (e.g. $CO_2$ gas, $N_2$ gas, a mixture of $CO_2$ and $N_2$) supplied from not-shown fluid sources.

Fixed to the inside upper part of the inner cylinder 27 is a discharging nozzles 56, which have a number of ejecting orifices 55 juxtaposed in the horizontal direction. The nozzles 56 are capable of ejecting processing liquids (e.g. pure water, IPA, various chemical liquids), $CO_2$ gas, $N_2$ gas, etc. supplied from not-shown fluid sources.

The discharging nozzles 54 and 56 are made of fluorinated resin, for example, PTFE, PFA or stainless steel. Note, the nozzles 54, 56 may be replaced by two or more nozzles, respectively.

Without being limited to the structures schematically shown in FIGS. 3 to 5, the discharging nozzle may be provided with the structures shown in FIGS. 6A and 6B. As shown in FIG. 6A, a discharging nozzle 54a is provided, on one face thereof, with a plurality of nozzle tips 91a, 91b. The nozzle tips includes the nozzle tips 91a of the number (twenty-six) equal to the number of wafers W that the rotor 24 can retain and two nozzle tips 91b arranged on both ends of the group of nozzle tips 91a. The discharging nozzle 54a further includes a supply pipe 92 attached to the back of the nozzle 54a to supply the processing liquid. The nozzle is fixed to the outer cylinder 26. In such a case, a rectangular hole, which has a shape corresponding to the outer shape of the nozzle 54a, is formed through the cylinder, and the nozzle 54a is fixed to the outer cylinder 26 with the nozzle 54a being fitted in the hole.

An ejection orifice 53a of each nozzle tip 91a is so designed that the processing liquid ejected therefrom fans out in plane to strike on the single wafer W in charge of the nozzle tip 91a at an angle with the wafer's face to be processed. In each nozzle tip 91b, the processing liquid ejected from the ejection orifice 53a operates to control the track of the processing liquid ejected from the adjacent nozzle tip 91a so that the processing liquid sticks on a designated area on the wafer W. If the nozzle tips 91b were not provided for the nozzle 54a, the tracks of the processing liquid ejected from the outermost nozzles tips 91a would be curved out of the target areas of the wafers W.

In the nozzle 54a of FIG. 6A, the nozzle tips 91a, 91b are positioned in zigzags in view of allowing the tips 91a, 91b of the shown size to correspond to the intervals of the wafers W retained in the rotor 24. Therefore, if adopting nozzle tips different from the shown tips 91a, 91b in configuration, then it is possible to align the so-shaped nozzle tips on the discharging nozzle. In such a case, the discharging nozzle will become slimmer than the shown nozzle 54a. Then, the arrangement space required for the discharging nozzle 54a can be reduced to miniaturize the outer cylinder or the inner cylinder.

A discharging nozzle 54b shown in FIG. 6B has a number of ejecting orifices 53b formed in a nozzle body 93, provided with no nozzle tip. In the nozzle 54b, because of the reduced intervals of the ejecting orifices 53b, it is easy to arrange the ejecting orifices 53b in a row. Owing to the removal of the nozzle tips, it is possible to simplify and miniaturize the structure of the discharging nozzle 54b. It is noted that the discharging nozzle 54b is also provided with twenty-eight ejecting orifices 53b. Two orifices on both sides of the ejecting orifices 53b in a row are provided for the same purpose as that of two orifices on both sides of the aforementioned ejecting nozzle 54a.

In the processing chambers 51, 52, there may be provided other discharging nozzles in addition to the discharging nozzles 54, 56, respectively. In such a case, the provided discharging nozzles may be provided with structures different from those of the discharging nozzles 54, 56 on consideration of the kinds of processing liquids.

Inside the top of the inner cylinder 27, discharging nozzles 75a, 75b are arranged to clean the inside faces of the circular plates 70a, 70b opposing the wafers W. The vertical walls 26a, 26b have discharging nozzles 74b, 74a arranged to clean the respective faces of the plates 70b, 70a opposing the vertical walls 26a, 26b, respectively. Mainly, these discharging nozzles 74a, 74b, 75a, 75b are used to rinse the circular plates 70a, 70b (after various chemical-processing treatment) by the pure water.

On the lower part of the vertical wall 26b, a first drain port 61 is provided to drain the chemical liquids, the pure water and IPA (after use) from the processing chamber 51 of FIG. 4. Above the first drain port 61, a second drain port 62 is arranged to drain the so-used chemicals, the pure water and IPA from the processing chamber 52 of FIG. 5. The first drain port 61 and the second drain port 62 are connected to a first drain pipe 63 and a second drain pipe 64, respectively.

On the upper part of the vertical wall 26b, a first exhaust port 65 is arranged to exhaust the processing chamber 51 under the condition of FIG. 4. Under the first exhaust port 65, a second exhaust port 66 is arranged to exhaust the processing chamber 52 in the condition of FIG. 5. The first exhaust port 65 and the second exhaust port 66 are connected to a first exhaust pipe 67 and a second exhaust pipe 68, respectively.

The vertical wall 26b has an extension wall formed to extend from the periphery of the wall 26 in the axial direction of the rotor 24 (see FIGS. 4 and 5). At the top part of the extension wall, a gas supply port 76 is formed to supply $CO_2$ gas. A gas supply pipe 77 is connected with the gas supply port 76. In the modification of the arrangement of FIGS. 4 and 5, the gas supply port 76 may be arranged in the vertical wall 26b, for example. $CO_2$ gas is supplied from a $CO_2$ gas supply system 80, which is shown in FIG. 8, to the gas supply port 76.

Figure 7A:
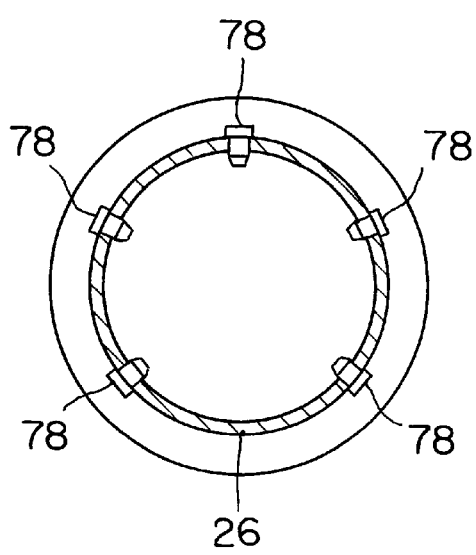
FIGS. 7A and 7B are front and side views of the outer cylinder showing the arrangement of nozzles for water/steam.
Figure 7B:
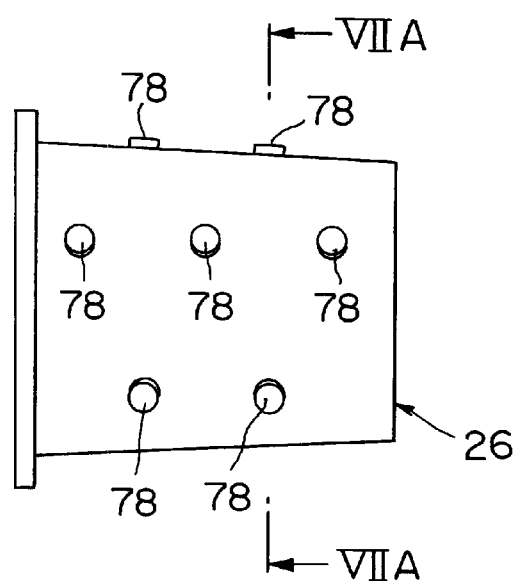

The outer cylinder 26 has a plurality of water/steam supply nozzle 78 attached to supply the interior of the processing chamber 51 with the pure water in the form of mist (simply referred as "water mist", hereinafter) and the vapor of pure water (simply referred as "steam", hereinafter). As shown in FIGS. 7A and 7B, there are provided the nozzles 78 of the plural number (12 pcs. in this embodiment). Nevertheless, single nozzle 78 is shown in FIGS. 4 and 5 for simplification of the drawings. The nozzles 78 are decentralized so that water mist or steam ejected therefrom spreads the surroundings of each wafer W uniformly. Water or steam is supplied to the nozzles 78 by a water/steam supply system 90.

Figure 8:
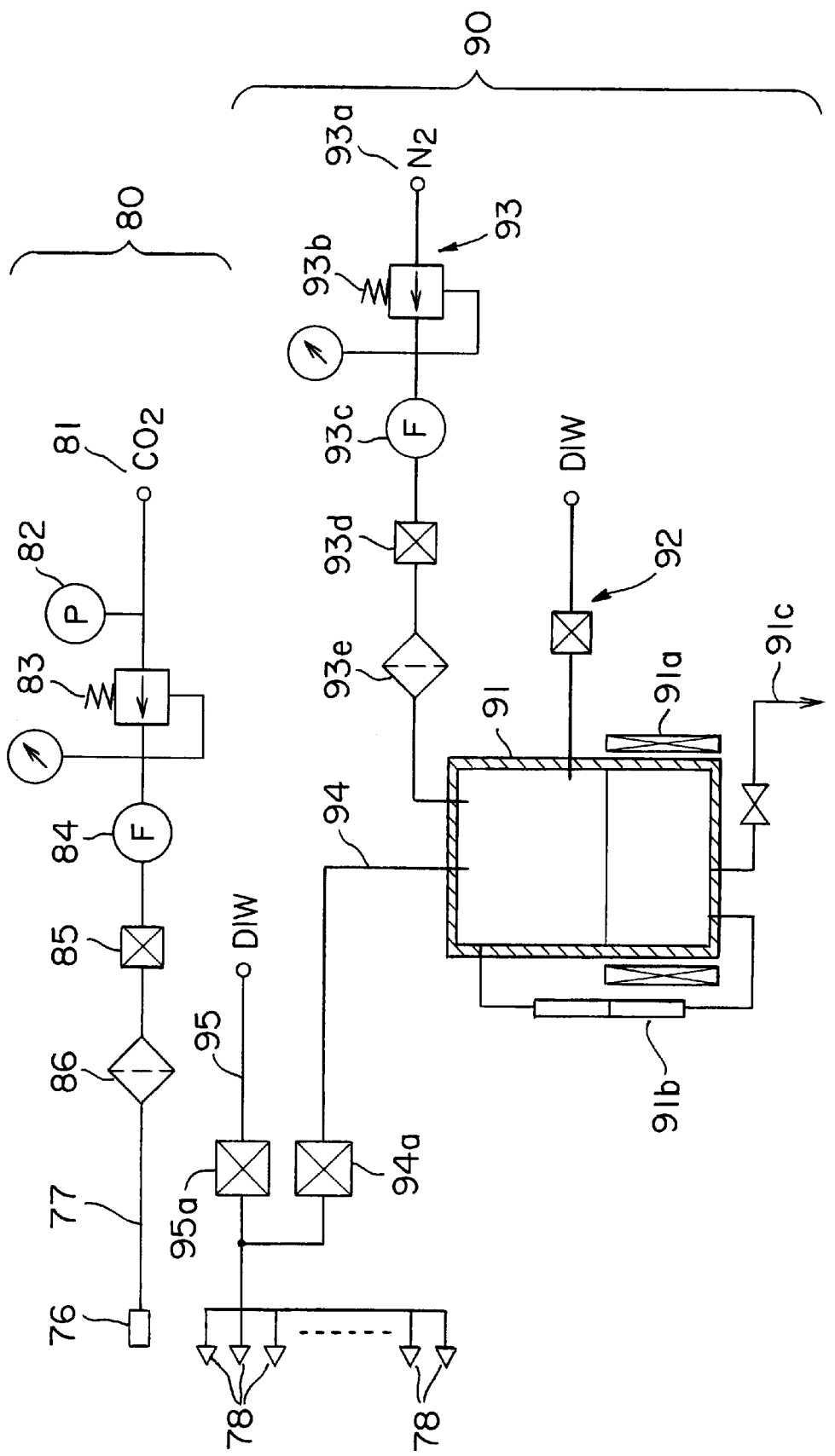
FIG. 8 is a structural diagram showing the structure of a $CO_2$ gas supply system and a water/steam supply system.

FIG. 8 illustrates a $CO_2$ gas supply system 80 connected to the gas supply port 76 and the water/steam supply system 90 connected to the nozzles 78. The $CO_2$ gas supply system 80 has a $CO_2$ gas source ($CO_2$ gas cylinder) 81, a pressure meter 82 for monitoring the pressure of the source 81, a pressure regulating valve 83, a flow meter 84, an open/close valve 85 and a filter 86 in sequence.

The water/steam supply system 90 has a pure water container 91 whose periphery is equipped with a heater 91a. The pure-water container 91 is provided with a level meter 91b and a drain 91c. A pure water line 91 and a carrier gas line 93 for supplying $N_2$ gas as carrier gas are connected with the pure water container 91. The carrier gas line 90 has a $N_2$ gas source 93a, a pressure regulating valve 93b, a flow meter 93c, an open/close valve 93d and a filter 93e in sequence. The pure water in the container 91 is heated into steam by a heater 91a. The steam is carried into a steam line 94 by the carrier gas. A pure water line 95 joins the steam line 94. The steam line 94 and the pure water line 95 have open/close valves 94a, 95a, interposed therein, respectively. The manipulation of the valves 94a, 95a allows the steam or pure water to be supplied to the nozzles 78 selectively. Each nozzle 78 has a built-in ultrasonic oscillator (not shown). The ultrasonic oscillator changes the pure water (liquid) supplied from the pure-water line 95 into fine waterdrops (making mist). When the pure water (liquid) is supplied to the nozzles 78, they spray the pure water so as to spread in a conical manner.

Next, we describe a method of cleaning the wafer W while using the above-mentioned cleaning apparatus 1. First, it is carried out to mount the carrier C in which the wafers W to be processed are accommodated, on a predetermined position of the mount table 10. Then, the carrier conveyer mechanism 12 conveys the carrier C to the stage section 4. The carrier C is mounted on the slide stage 32 standing ready on the stage 13 of the stage section 4. Next, the slide stage 32 is moved onto the stage 31 of the carrier standby section 30. It is executed to position the outer cylinder 26 and the outer cylinder 27 in their standby positions. Upon raising the wafer holding member 41 by the elevator unit 43, the wafers W are taken out of the carrier C and moved into the rotor 24 of the cleaning section 20. After the wafer W are held by the rotor 23, the wafer holding member 41 is lowered, Next, the outer cylinder 26 and the inner cylinder 27 are shifted to the processing positions to define the processing chamber 52 in the inner cylinder 27. Then, the rotor 24 holding the wafers W is rotated by the motor 23. It is executed to allow the nozzle 56 to eject a designated chemical liquid while rotating the wafers W thereby to remove resists on the wafers W. This operation is carried out one time or several times.

Next, the inner cylinder 27 is slid to the standby position to define the processing chamber 51 of the outer cylinder 26. Under such a situation, it is first carried out to perform the cleaning process. In the cleaning process, an $CO_2$ gas-enriched atmosphere is established in the processing chamber 51. The resistivity of the pure water, which contacts with the wafer and $CO_2$ gas is dissolved therein, is, preferably, 0.2 M cm or less. The required $CO_2$ gas concentration in the processing chamber, in order to achieve the preferable resistivity of the pure water, varies depending on the way how to feed $CO_2$ gas into the processing chamber 51 and depending on the routines of the cleaning process (see routines (1) to (4) mentioned later), however, the $CO_2$ gas concentration in the processing chamber should be greater than that in the air, preferably 20 vol % or greater. In this state, the pure water for rinsing is ejected from the nozzle 54 while rotating the rotor 24 holding the wafers W by the motor 23.

In case of the cleaning process under the above conditions, the ejected pure water comes into contact with $CO_2$-gas in the atmosphere and subsequently strikes against the wafers W while the resistivity of pure water is lowered as a result of the solution of $CO_2$-gas in the pure water. Therefore, since the occurrence of static electricity is restricted, it is possible to prevent the discharge breakdown on the wafers W.

It is noted that the pure water having $CO_2$-gas dissolved therein represents weak acidity. Here, when the cleaning process using the pure water follows the cleaning process using the chemical liquid of organic-amine type, alkaline substances are produced. It is likely that the alkaline substances shall have damage on various circuits built on the wafers W.

According to the present method, however, there is no possibility of such a problem since the alkaline substances are neutralized by the above pure water having $CO_2$ gas dissolved therein.

Without increasing the manufacturing cost and size, the cleaning apparatus of this embodiment can take effect similar to that of the other cleaning apparatus equipped with an exclusive unit for producing $CO_2$ injection water.

As the concrete steps to perform the cleaning process using the pure water under the $CO_2$ gas-enriched atmosphere, there can be expected the following routines (1) to (4):

(1) Supply the processing chamber 51 with $CO_2$ gas through the nozzle 54, and subsequently eject the pure water through the nozzle 54. Note, since no $CO_2$ gas is supplied during the ejection of pure water, it is unavoidable that the concentration of $CO_2$ gas in the processing chamber 51 is gradually reduced in the course of process. In this view, it is desirable to establish the concentration of $CO_2$ gas relatively high at the start of cleaning process in order to ensure the atmosphere of $CO_2$ gas more than a predetermined concentration at the end of the cleaning process.

(2) Eject $CO_2$ gas and the pure water through the nozzle 54 simultaneously. In this case, it is appropriate to eject $CO_2$ gas prior to the ejection of pure water and subsequently eject $CO_2$ gas and the pure water through the nozzle 54 simultaneously. Then, there is no need of contrivance to facilitate dissolution of $CO_2$ gas into the pure water in advance of ejecting from the nozzle 54, for example, the provision of a filter in a $CO_2$ gas injection water maker. In this case, however, the discharging nozzle 54 ejects the pure water containing air bubbles. Therefore, it is necessary to appropriately adjust the ejection ratio of pure water to gas in quantity and the mixing condition between pure water and gas so that the configuration of the pure water ejected from the nozzle 54 is not disturbed.

(3) Eject the pure water from the nozzle 54 while supplying gas containing $CO_2$ gas from the gas supply port 76. According to this method, it is possible to avoid the problems that might be caused in the above cases (1) and (2). In this case, it is desirable that, for example, $CO_2$ gas is introduced into the processing chamber 51 at the flow rate of 0.4 to 0.5 liter per minute thereby to establish a condition where a predetermined concentration of $CO_2$ gas exists in the processing chamber 51 prior to the ejection of pure water.

Continuously, the ejecting of pure water from the nozzle 54 and the exhausting through the first exhaust port 65 are carried out while maintaining the supply of gas containing $CO_2$-gas and rotating the rotor 24 having the wafers W. According to this method, the cleaning process can be accomplished while establishing a constant concentration of $CO_2$-gas in the processing chamber 51.

(4) Fill up the processing chamber 51 with the gas containing $CO_2$-gas and subsequently supply the chamber 51 with water mist or steam via the water/steam nozzle 78 thereby to dissolve $CO_2$-gas in the mist or steam. Thereafter, any one of the steps (1) to (3) is performed. In this case, without being blown against the wafers W vigorously, the water mist or steam is supplied from the nozzle 78 so as to float in the circumference of the wafers W. The $CO_2$-gas is easy to dissolve in the water mist or the water vapor, particularly, steam. The water mist or steam having $CO_2$-gas dissolved therein comes in contact with the pure water ejected from the discharging nozzle 54, for a mixture. According to this method, it is possible to effectively dissolve $CO_2$-gas in the pure water in comparison with the method of directly dissolving $CO_2$-gas in the pure water ejected from the discharging nozzle 54.

It is also advantageous to allow the surfaces of the wafer W to directly contact $CO_2$-gas at periodical standstills of the pure-water supply in the cleaning process. Then, the ejected pure water strikes against the wafers W while or after involving $CO_2$-gas on the surfaces of the wafers W. In the above-mentioned cleaning apparatus 1, it is easy to stop the supply of pure water temporarily. Further, it is easy to establish the exposed surfaces of the wafers W by rotating the rotor at a high speed at the standstill of water supply thereby to shake the pure water or chemical residuals off the surfaces of the wafers W.

After completing the rinsing process, it is executed to eject $N_2$-gas from the nozzle 54 and rotate the rotor 24 at a higher speed than that of the chemical cleaning process or the rinsing process, performing so-called "spin drying".

After the spin drying operation is completed, then the outer cylinder 26 is slid to the standby position to expose the rotor 24 to the outside. Next, the wafer holding member 41 of the wafer moving mechanism 40 is elevated to hold the wafers W retained in the rotor 24. Then, the wafers W are held by the wafer holding member 41 through other grooves different from the grooves which have been used in loading the wafers W into the rotor 24. In this way, it is possible to prevent particles from sticking to the cleaned wafers W again.

Subsequently, the wafer holding member 41 with the cleaned wafers W is lowered. During this descent of the member 41, the number of wafers W is counted by the wafer detector 99. When the wafer holding member 41 passes through the carrier C standing ready at the carrier standby section 30, the wafers W are retained in the wafer holding grooves in the carrier C. By the carrier conveyer mechanism 35, the carrier C having the wafers W accommodated therein is unloaded to the stage section 4. Further, by the carrier conveyer mechanism 12, the carrier C is mounted on the mount table 10 of the in/out port 2. Finally, the carrier C is further unloaded out of the cleaning apparatus 1 by means of an operator or an automatic conveyer unit.

It is noted that the apparatus for performing the method of the first embodiment is not limited to the shown cleaning apparatus 1. Additionally, the present method of the invention is not limited to the cleaning process for the semiconductor wafers. Of course, the present method is applicable to cleaning process for other substrates, such as substrates for liquid crystal display (LCD) units.

[2nd. Embodiment]

Next, the second embodiment of the present invention will be described with reference to FIGS. 9 to 13.

Figure 9:
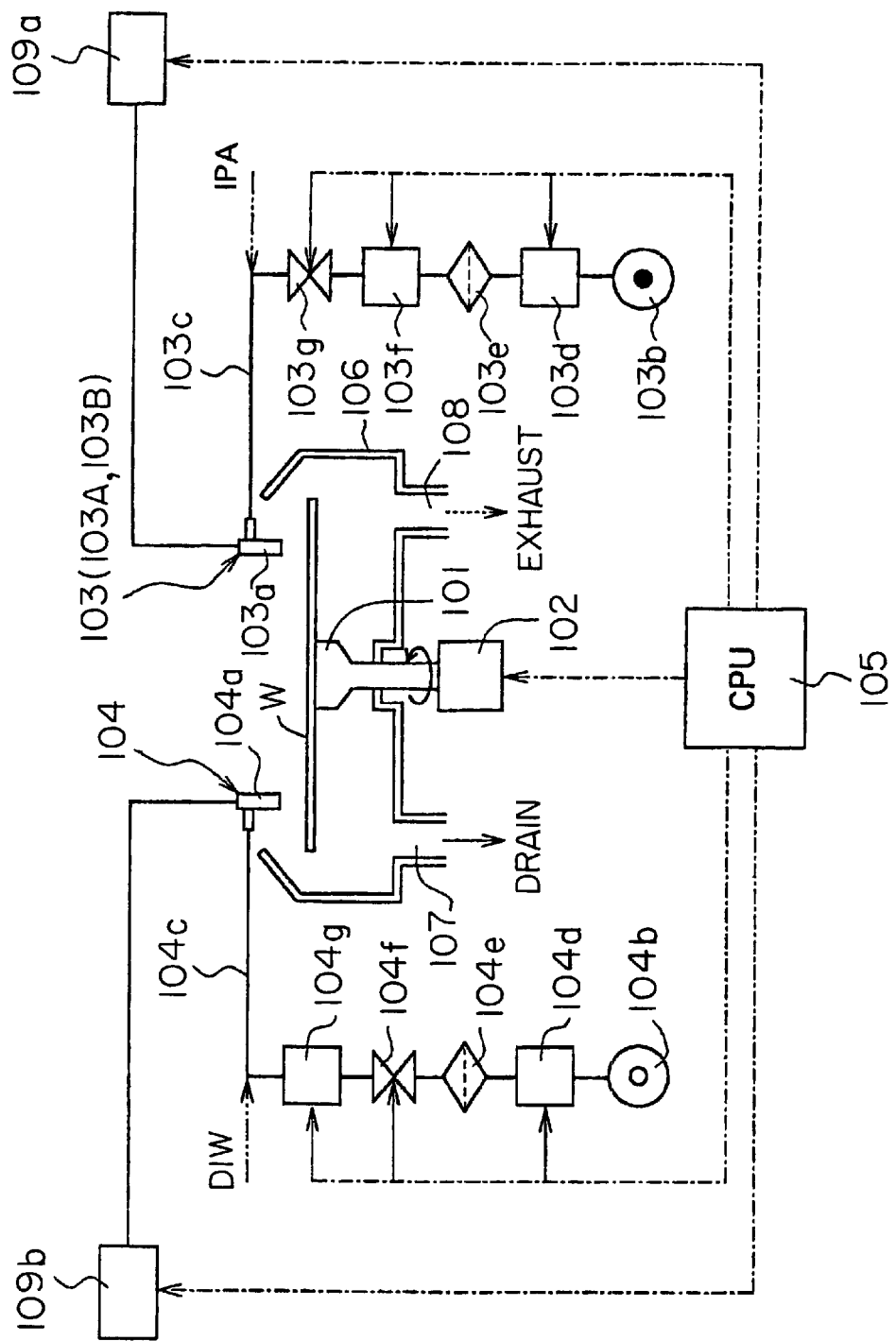
FIG. 9 is a schematic diagram showing the structure of the cleaning apparatus of the second embodiment of the invention.

FIG. 9 shows a single wafer cleaning apparatus. This cleaning apparatus includes a spin chuck 101 for carrying the semiconductor wafer W as the substrate to be processed, a motor 102 for rotating the spin chuck 101 and a processing liquid supplying system 103 for supplying the processing liquids to the surface of the wafer W mounted on the spin chuck 101. The system 103 includes a chemical supply unit 103A for supplying chemical liquids, for example, resist removing liquid (i.e. resist stripper), polymer removing liquid (polymer remover), etc. and a chemical-solvent supply unit (IPA supply unit) 103B for supplying a chemical solvent (e.g. isopropyl alcohol). The cleaning apparatus further includes a dry-gas supply unit ($N_2$ supply unit) 104 for supplying inert gas (e.g. $N_2$-gas), dry gas (e.g. fresh air), etc. and a control unit 105 for at least controlling the timing to supply the processing liquids and remove them.

Hereat, the chemical solvent corresponds to a liquid that would make reaction with neither of the chemical liquid and the sequent rinsing liquid. Further, any chemical solvent will do so long as it can wash away the chemical liquids adhering to the wafer W and the chambers.

A cup 106 is arranged around and below the spin chuck 101 and the wafer W mounted on the spin chuck 101. The cup 106 serves to prevent the chemical liquids and IPA from scattering out of the apparatus. The cup 106 is provided, on its bottom, with a drain port 107 and an exhaust port 108.

The processing liquid supply unit 103 is equipped with a chemical nozzle 103a to supply (eject) the upper face of the wafer W with the processing liquid, for example, the chemical liquid. Owing to the provision of a moving mechanism 109a, the nozzle 103a is movable above the wafer W horizontally and vertically. There is a chemical pipe line 103c which connects the nozzle 103a with a chemical source 103b. The chemical pipe line 103c has, in order from the chemical source 103b, a chemical pump 103d, a filter 103e, a temperature controller 103f for controlling a temperature of the chemical liquid to a predetermined temperature and an open/close valve 103g. Between the valve 103g and the nozzle 103a, a not-shown IPA source is connected with the chemical pipe line 103c through a not-shown switching valve.

The $N_2$ supply unit 104 is equipped with a $N_2$-gas nozzle 104a to supply (spout) $N_2$-gas to the upper surface of the wafer W. Owing to the provision of a moving mechanism 109b, the nozzle 104a is also movable above the wafer W horizontally and vertically. There is a $N_2$-gas pipe line 104c which connects the nozzle 104a with a $N_2$-gas source 104b. The $N_2$-gas pipe line 104c has, in order from the source 104b, a flow controller 104d, a filter 104e, an open/close valve 104f and a temperature controller 104g for adjusting a temperature of $N_2$-gas to a predetermined temperature.

Between the temperature controller 104g and the nozzle 104a, a not-shown pure water source is connected with the pipe line 104c through a not-shown switching valve.

The control unit 105 has a central processing unit (CPU). Control signals of the control unit 105, which will be referred as "CPU 105" hereinafter, are transmitted to the motor 102, both moving mechanisms 109a, 109b (i.e. a driving system of the apparatus), the chemical supply unit 103 (i.e. the chemical pump 103d, the temperature controller 103f and the open/close valve 103g) and also the $N_2$-gas supply unit 104 (i.e. the flow controller 104d, the open/close valve 104f and the temperature controller 104g).

By the control signals from the CPU 105, the rotation of the motor 102 can be switched to any one of ranges: low-speed range (1 rpm–500 rpm), middle-speed range (100 rpm–500 rpm) and high-speed range (500 rpm–1000 rpm).

By the control signals from the CPU 105, the chemical nozzle 103a and the $N_2$-gas nozzle 104a can move above the wafer W horizontally and vertically. In other words, the chemical nozzle 103a and the $N_2$-gas nozzle 104a can move in regard to the wafer W relatively. Furthermore, the control signals of the CPU 105 allow the wafer W to be supplied with a designated quantity of chemical liquid or $N_2$-gas. Although not shown in the figure, the control signals of the CPU 105 are transmitted to the IPA supply unit and the pure-water supply unit, accomplishing to supply the wafer W with a designated quantity of IPA or pure water.

The cleaning method performed by the cleaning apparatus of FIG. 9 will be described with reference to FIGS. 9 to 13.

First, bring the wafer W onto the spin chuck 101 by a not-shown transporting unit and further allow the chuck 101 to hold the wafer W thereon. Next, move the chemical nozzle 103a upward of the center of the wafer W.

In this state, the spin chuck 101 and the wafer W are rotated with the revolutions of 35 r.p.m. (low speed), for example and simultaneously, a predetermined quantity of polymer remover L (chemical liquid) is spouted from the chemical nozzle 103a. This operation is continued for a predetermined period (for example, 3 seconds). Consequently, the polymer remover L invades grooves (trench) G and holes (contact holes) H on the wafer W. As shown in FIGS. 13A and 13B, the polymer remover L comes into contact with polymers P sticking to both grooves G and holes H and further makes the reaction with the polymers P thereby to dissolve the polymers P partially for their removal [see step 1, FIGS. 10, 11(a) and 12].

However, it is noted that the rotation of the wafer W at low speed cannot make the polymer remover L invade all the grooves G and all the holes perfectly. If the polymer remover L can do, there remains a possibility that the remover L stays in the grooves G and the holes H to obstruct an invasion of new chemical liquids. From this point of view, the rotation at middle speed follows the above rotation at low speed.

Keeping the chemical nozzle 103a ejecting the designated quantity of polymer remover L, the rotating speed of the wafer W and the spin chuck 101 is accelerated to 100 rpm (middle speed) and this operation is continued for a predetermined period (for example, 3 seconds). As a result, it is possible to allow the chemical liquid to invade the grooves G and the holes H into which the chemical liquid did not invade sufficiently at step 1. Additionally, the polymer remover L remained in the grooves G and the holes H is replaced with new polymer remover L. This flowing of the polymer remover L in the grooves G and the holes H allows the chemical processing to be effected (step 2).

Next, stop to eject the polymer remover L and rotate the spin chuck 101 and the wafer W with the revolutions of 800 rpm (high speed), thereby shaking off the used polymer remover L sticking to the wafer surface by its centrifugal force (step 3).

When the operation at step 3 is finished, start the operation at step 1 again. Thus, it is possible to replace the polymer remover L after reaction by a new polymer remover L before reaction. Note, the terms "after reaction" in the above description signifies a situation that the reactivity of the remover L is deteriorated (slow in reaction speed) as a result of sufficient progress of reaction. While, the terms "new" and "before reaction" signify one situation that the polymer remover has not been reacted yet to exhibit a high reactivity or another situation that despite of the reaction, the polymer remover has recovered a required reactivity as a result of passing through the filter etc. The operations at step 1, step 2 and step 3 are executed, in that order, repeatedly.

In the above-mentioned embodiment, there are respectively established the low speed rotation of 35 rpm, the middle speed rotation of 100 rpm and the high speed rotation of 800. The respective revolutions may be changed within the range of 1 to 150 rpm for the low speed rotation, the range of 100 to 500 rpm for the middle speed rotation and the range of 500 to 3000 rpm for the high speed rotation, appropriately. Alternatively, depending on the kind of polymer remover L on use, the respective revolutions may be altered over the above ranges. Also, the periods of duration at step 1, step 2 and step 3 may be altered appropriately.

Note, when the chemical-processing process is carried out at high temperatures, it is desirable to establish the temperature of the chemical liquid L somewhat larger than its optimum processing temperature, in view of accomplishing the appropriate chemical-processing process.

Upon confirmation of the execution of repeating the operations at steps 1, 2 and 3 by designated times (step 4), the switching valve interposing in the chemical pipe line 103c is activated to allow the chemical nozzle 103a to eject a designated quantity of solvent for the chemical liquid L, for example, IPA.

Thereafter, there are carried out the following steps of:
ejecting the IPA liquid (solvent of the chemical liquid L) through the chemical nozzle 103a, rotating the chuck 101 and the wafer W at row speed of 35 rpm and maintaining this situation for approx. 3 seconds (step 5);
accelerating the above rotation of the chuck 101 and the wafer W up to the revolutions of 100 rpm (middle speed) while ejecting the chemical nozzle 103a and the IPA liquid and maintaining this situation for approx. 3 seconds (step 6);
stopping the ejection of the IPA liquid, accelerating the rotation of the chuck 101 and the wafer W up to the revolutions of 800 rpm (high speed) and maintaining this situation for approx. 3 seconds (step 7); and
repeating the operations of steps 4, 5 and 6, in that order, by tens to hundreds of times.

In this way, the chemical components of the polymer remover sticking to the wafer surface, the grooves G and the holes H formed on the surface are completely removed.

Since the IPA liquid has a stickiness smaller than that of the polymer remover, the operations of step 4 and step 5 may be integrated to one step. That is, at step 4, it will be executed to eject the IPA liquid through the chemical nozzle 103a while rotating the wafer W at an appropriate speed within the range from 1 to 500 rpm. (low speed to middle speed). Then, the operation of step 5 can be eliminated.

On confirmation of the execution of repeating the operations at steps 5, 6 and 7 by designated times (step 8), the moving mechanism 109a of the chemical nozzle 103a is activated to allow it to retreat to the standby (turnout) position. On the other hand, the $N_2$-gas nozzle 104a also serving to supply the pure water is moved upward of the center of the wafer W. Next, supply the wafer W with the pure water (rinsing liquid) supplied from the pure water source (not shown) while rotating the wafer W thereby to remove IPA left on the wafer surface (step 9).

After completing the rinsing process in the above manner, the switching valve (not shown) interposed in the $N_2$-gas pipe line 104c is activated. It is executed to supply the wafer surface with $N_2$-gas through the $N_2$-gas nozzle 104a thereby to remove droplets adhering to the wafer surface (step 10). If adjusting the temperature of $N_2$-gas higher than the room temperature by the temperature controller 104g, then it is possible to carry out the drying process effectively. Further, the combining the rotation of the wafer W with the horizontal reciprocation of the $N_2$-gas nozzle 104a would allow the drying process to be completed promptly. After the drying process, the wafer W is unloaded out of the spin chuck 101, completing the cleaning process.

We now describe test results in order to confirm the effect of the invention.

In the embodiment of the present invention, the wafer cleaning was carried out by repeating the operations of steps 1, 2 and 3 by several times. For a comparison, we further performed the wafer cleaning by repeating the operations of steps 1 and 3 by several times. The results are shown in the table below.

TABLE 1

| | Example | Comparative Example |
|---|---|---|
| Conditions of Chemical processing | Chemical (polymer remover) ejection: 35 rpm & 3 sec. (STEP 1) ↓ Chemical ejection: 100 rpm & 3 sec. (STEP 2) ↓ Chemical ejection: 800 rpm & 3 sec. (STEP 3) (Repeating steps 1, 2, 3 for 10 times) | Chemical (polymer remover) ejection: 35 rpm & 3 sec. (STEP 1) ↓ Chemical ejection: 800 rpm & 3 sec. (STEP 3) (Repeating steps 1, 3 for 20 times) |
| Presence of Polymer Residuals | Wafer surface Not present / Grooves Holes Not present | Wafer surface Not present / Grooves Holes Present |

As shown with the table 1, it will be understood that the polymer on the wafer surface and the same in both grooves G and holes H are removed in the embodiment of the invention substantially perfectly. While, in the comparative example, the polymer in both grooves G and holes H are not removed perfectly although the polymer on the wafer surface is removed.

[3rd. Embodiment]

The second embodiment of the invention relates to the cleaning apparatus for cleaning a single wafer. Nevertheless, according to the present method, it is possible to process a plurality of wafers W at a time in the same manner as above.

The method of cleaning and drying the wafers will be described with reference to FIGS. 14 to 17.

As shown in FIG. 14, the cleaning apparatus comprises an in/out port 200 for loading and unloading containers, for example, carriers C each having a plurality (e.g. 25 pcs.) of wafers W accommodated therein vertically, a cleaning unit 203 for applying the liquid processing and drying on the wafers W and an interface section 204 arranged between the in/out port 200 and the cleaning unit 203 to perform the delivery of the wafers W, the positional adjustment, the change of posture, etc. Note, beside the in/out port 200 and the interface section 204, there are provided carrier-stocking units 650 each accommodating the vacant carrier C temporarily and a carrier cleaning unit 206 for cleaning the carrier C. The in/out port 200 is arranged on one side of the cleaning/drying apparatus, provided with a carrier-loading section 201 and a carrier-unloading section 202 parallel with the section 201.

A carrier table 207 is arranged in the interface section 204. Arranged between the carrier table 207 and the in/out port 200 is a carrier transporting unit 208 which transports the carrier C from the carrier loading section 201 onto the carrier table 207 or the carrier-stocking unit 205 and also which conveys the carrier C on the carrier table 207 to the carrier-unloading section 202 or the carrier-stocking unit 205. Further, the interface section 204 is provided with a conveyer path 209, which extends up to the cleaning unit 203. On the conveyer path 209, a wafer-transporting chuck 210 is arranged so as to be movable on the path 209. The wafer transporting chuck 210 transports the unprocessed wafers W, which have been brought from the carrier C on the carrier table 207, to the cleaning unit 203. Further, the chuck 210 supplies the wafers W processed by the cleaning unit 203 into the carrier C.

Figure 15:
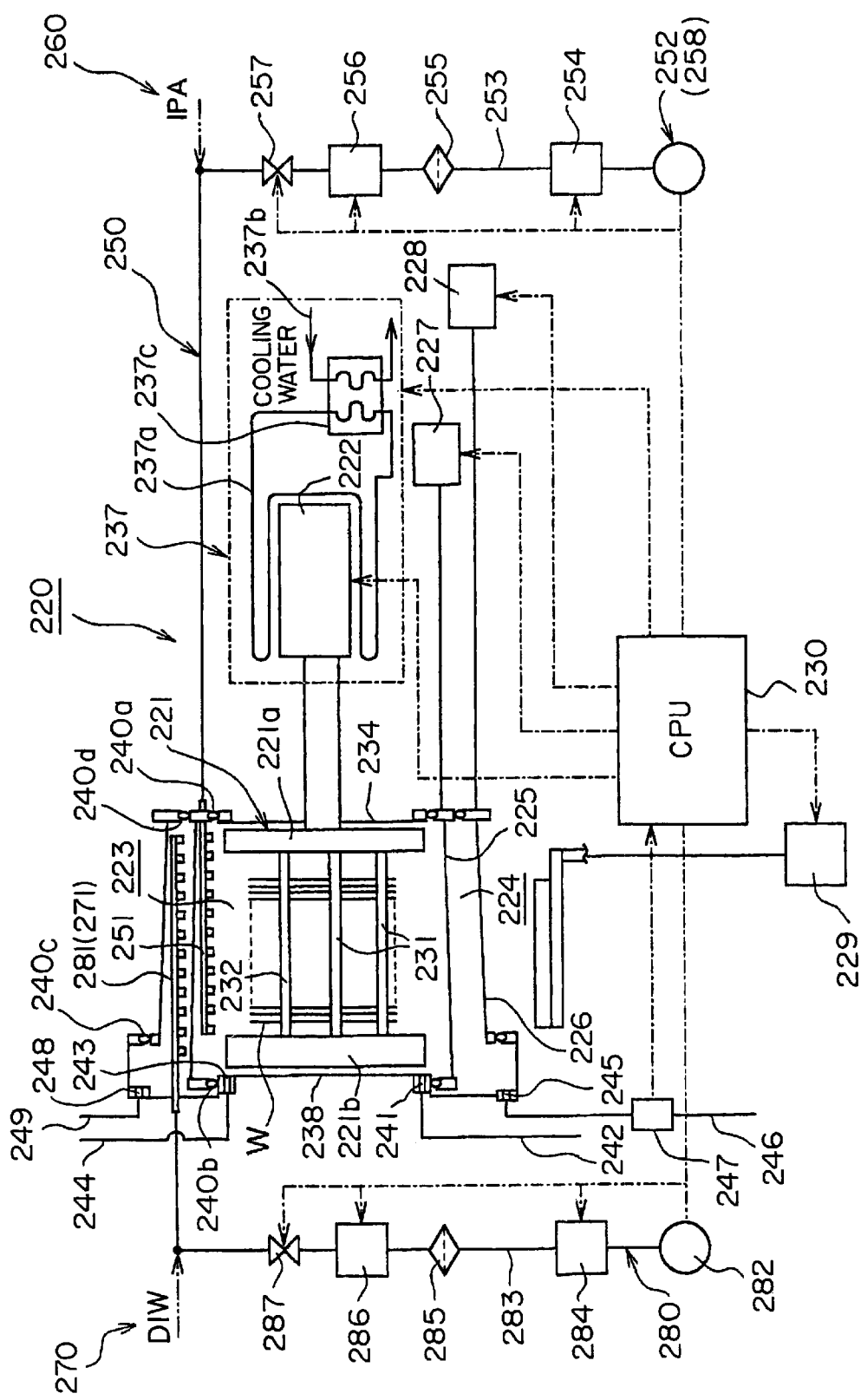
FIG. 15 is a schematic structural view of the cleaning apparatus of FIG. 14.

The cleaning unit 203 is provided with a processing device 120 which removes resists, polymer, etc. sticking to the wafers W. As shown in FIG. 15, the processing device 220 has a rotor 221 for holding the wafers W, a motor 222 for rotating the rotor 221, an inner cylinder 225 and an outer cylinder 226 both capable of surrounding the wafers W. Owing to the provision of a first actuator cylinder 227 and a second actuator cylinder 228, the inner and outer cylinders 225, 226 can be moved to their surrounding positions to surround the rotor 221 and their standby positions apart from the surrounding positions, respectively. The inner cylinder 225 and the outer cylinder 226 define a first processing chamber 223 and a second processing chamber 224 therein, respectively.

The processing device 220 further includes a chemical supply unit 250 for supplying the wafers W accommodated in the inner cylinder 225 or the outer cylinder 226 with a processing fluid, for example, chemicals of resist stripper, polymer remover, etc., a solvent supply unit 260 for supplying the solvent for the chemical liquid (e.g. isopropyl alcohol: IPA), a rinse supply unit 270 for rinsing the wafers W with a rinsing liquid (e.g. pure water) and a dry-gas supply unit 280 for supplying the wafers W with dry gas, such as inert gas (e.g. $N_2$ gas) and fresh air.

Further, the processing device 220 is provided with a wafer delivery hand 229 for performing the delivery of the wafers W between the wafer transporting chuck 210 (see FIG. 14) and the rotor 221.

In the so-constructed processing device 220, all the operations of the motor 222, respective supply parts of the units 250, 260, 270, 280, the wafer delivery hand 229, etc. are controlled by a control unit, for example, a central processing unit (CPU) 230.

The rotor 221 is connected to a drive shaft 222a of the horizontal motor 222, in a manner of a cantilever. Holding the wafers W having their processing surfaces in the vertical arrangement, the rotor 221 is rotatable about the horizontal axis. The rotor 221 has a first rotor disc 221a and a second rotor disc 221b opposing the first rotor disc 221a. The first rotor disc 221a has a rotor shaft 221A connected to the drive shaft 222a of the motor 222 through a coupling 222b. Four immovable rods 231 bridge a gap between the first rotor disc 221a and the second rotor disc 221b. The rotor 221 is further provided with a pair of movable rods 232. The movable rods 232 are rotatable between their holding positions to hold the wafers W accommodated in the rotor 221 and their releasing positions to take the wafers W in and out of the rotor 221. The movable rods 232 in the holding positions hold the wafers W together with the immovable rods 231, through the wafer holding grooves formed in the rods 231, 232.

The rotor shaft 221A of the rotor 221 is rotatably supported by a first vertical wall 234 through bearings 233. A labyrinth seal 235 is arranged adjacently to the bearing 233 closer to the first vertical wall 234 in order to prevent particles of the motor 222 from invading the processing chamber (see FIG. 16). The motor 222 is accommodated in a support cylinder 235 connected to the first vertical wall 234. In accordance with a program stored in the CPU 30 in advance, the motor 222 rotates at predetermined revolutions.

As mentioned later, there is a possibility that the motor 222 is overheated due to the repetition of high-speed rotations and low-speed rotations. Therefore, the motor 222 is provided with a cooling unit 237 for restricting the motor's overheating. As shown in FIG. 15, the cooling unit 237 is formed by a circulatory cooling pipe 237a disposed around the motor 222 and a heat exchanger 237c for cooling coolant confined in the cooling pipe 237a. The heat exchanger 237c includes the cooling pipe 237a and a coolant supply pipe 237b partially. Employed as the coolant is an electrically-insulating and heat-conductive liquid which does not cause a short circuit in the motor 222 even if the liquid is leaked. For example, ethylene glycol is suitable for the coolant. In order to allow of the operation based on signals from a not-shown temperature sensor, the cooling unit 237 is controlled by the CPU 230. The cooling unit 237 does not always include the above-mentioned structure. It may be replaced by, for example, a cooling unit of air-cooled type, an electric cooling unit with Peltier elements, etc.

The first processing chamber 223 is defined by the first vertical wall 234, a second vertical wall 238 opposing to the wall 234 and the inner cylinder 225. The inner cylinder 225 is engaged with the first vertical wall 234 and the second vertical wall 238 through first and second seal members 240a, 240b, respectively. By the expanding action of the first actuator cylinder 227, the inner cylinder 225 is moved to a position to surround the rotor 221 and the wafers W, defining the first processing chamber 223, i.e. an inner chamber. Then, the inner chamber 223 is sealed to both of the first vertical wall 234 and the second vertical wall 238 via the first sealing member 240a and the second sealing member 40b, respectively (see FIGS. 15 and 16).

By the shrinking action of the first actuator cylinder 227, the inner cylinder 225 is moved to a circumferential position of the support cylinder 236, namely, standby (retracted) position. Then, the leading opening of the inner cylinder 225 is sealed to the first vertical wall 234 through the second sealing member 240b. While, the base part of the inner cylinder 225 is sealed to a flange part 236a at the longitudinal center of the support cylinder 236 through the first sealing member 240a. In this way, it is possible to prevent the leakage of chemical atmosphere remained in the inner cylinder 225.

The second processing chamber 224 is formed by the first immovable (vertical) wall 234, the leading end of the inner cylinder 225 moved to the standby position to engage with the wall 234 through the first sealing member 240a, and the outer cylinder 226 engaging with the second immovable (vertical) wall 238 and the inner cylinder 225 through a third sealing member 240c and a fourth sealing member 240d, respectively.

By the expanding action of the second actuator cylinder 228, the outer cylinder 226 is moved to a position to surround the wafers W and the rotor 221. At this position, the outer cylinder 226 is sealed to the second vertical wall 238 and the inner cylinder 225 through the third sealing member 240c and the fourth sealing member 240d respectively, forming the second processing chamber 224.

By the shrinking action of the second actuator cylinder 228, the outer cylinder 226 is moved to a circumferential position (standby position) of the support cylinder 236. In this case, the fourth sealing member 240c is interposed between the outer cylinder 226 and the base end of the inner cylinder 225, for sealing. Then, the interior atmosphere of the inner chamber (the first processing chamber) 223 and the interior atmosphere of the outer chamber (the second processing chamber) 224 are separated from each other in a fluid-tight manner. Therefore, there is no possibility that the atmosphere in the chamber 223 is mixed with the atmosphere in the chamber 224, preventing the occurrence of cross-contamination due to the reaction between different processing fluids.

It is noted that each of the first to fourth sealing members 240a–240d is composed of a hollow gasket (packing) capable of inflating toward one side of an object to be sealed. In order to inflate the hollow gaskets, there is provided a compressor (not shown) which supplies the gaskets with compressed air. The hollow gaskets are made of synthetic rubber abounding in heat-resistance, chemical-resistance and climate-proof, such as ethylene-propylene-diene mucilage (EPDM) and Callets (product name).

The inner and outer cylinders 225, 226 are together tapered so as to extend outward against their leading ends. Consequently, when the rotor 221 is rotated in the inner cylinder 225 or the outer cylinder 226, the inside air stream spirally flows toward the expanded side of the cylinder 225 (or 226), allowing the chemical liquid or the like to be forced to the expanded side for each discharge.

The inner and outer cylinders 225, 226 are slidable along three parallel guide rails (not shown) extending between the second immovable wall 238 and a sidewall 239 in the horizontal direction. The axis of the inner cylinder 225 substantially coincides with the axis of the outer cylinder 226. Owing to the coaxial arrangement of the cylinders 225, 226, it is possible to reduce the installation space for the inner and outer cylinders 225, 226 and also possible to miniaturize the apparatus itself.

The inner and outer cylinders 225, 226 are made of stainless steel. Additionally, the inner cylinder 225 is covered, on its outer face, with a thermal insulating layer, for example, polytetrafluoroethylene (trademark: Teflon) layer which serves to prevent the cool down of the chemical liquids and their vapor in the inner chamber 223.

Figure 16:
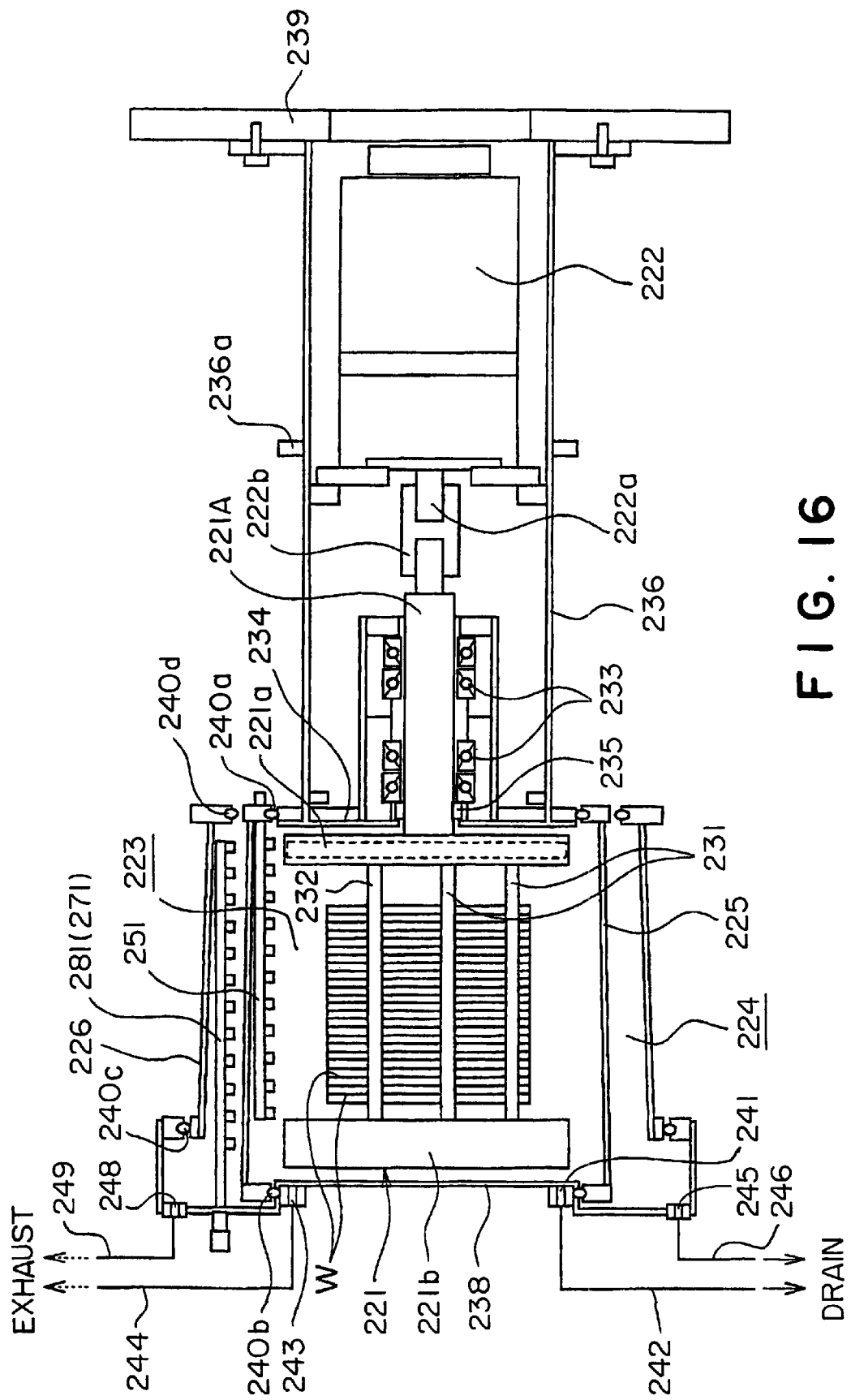
FIG. 16 is a sectional view of an essential part of the cleaning apparatus of FIG. 14.
Figure 17:
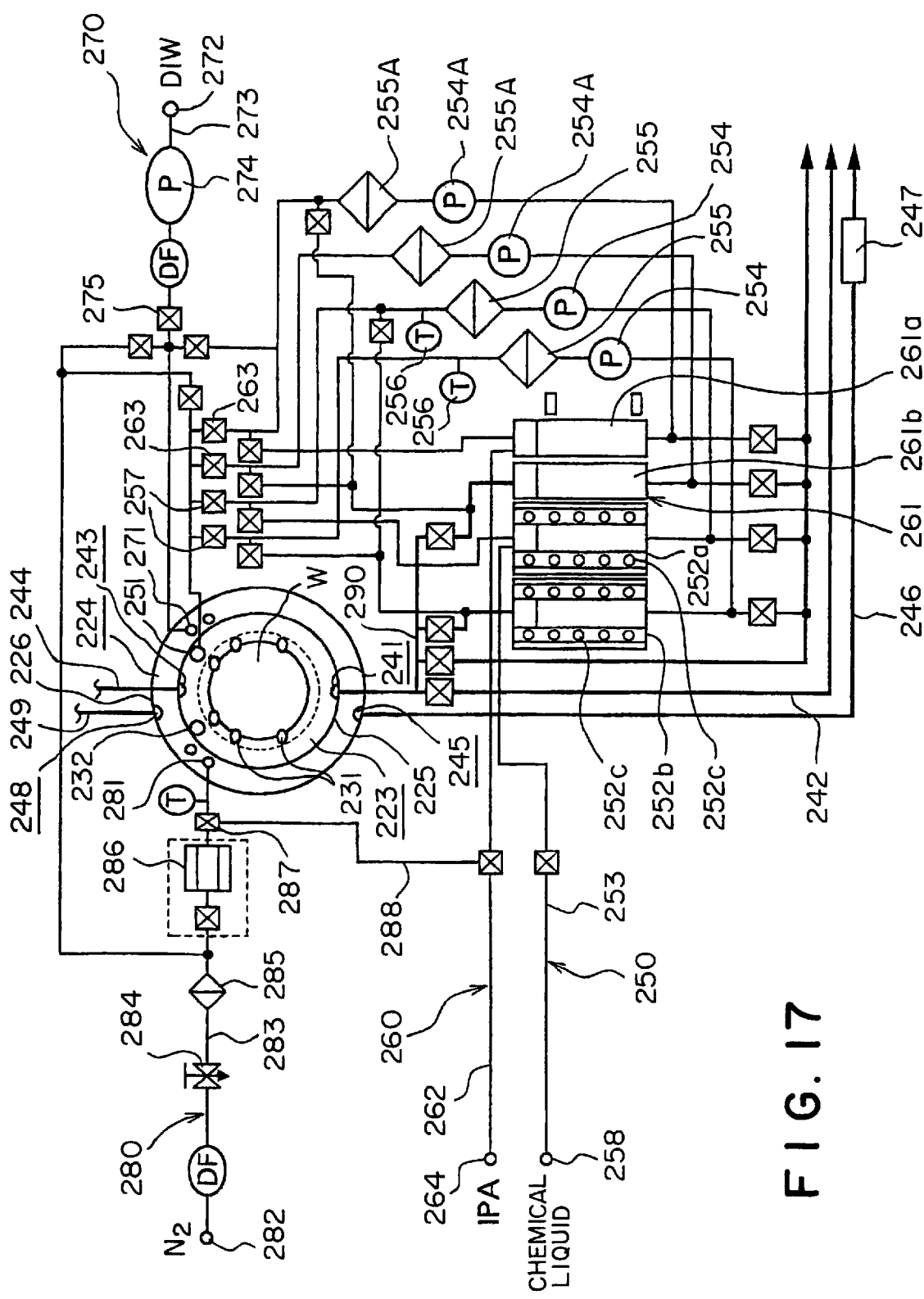
FIG. 17 is a view showing a piping system of the cleaning apparatus of FIG. 14.

In the above processing fluid supply unit, the chemical (e.g. polymer stripper) supply unit 250 has a chemical nozzle 251 attached to the inner cylinder 225, a chemical supply part 252, a pump 254 interposed in a chemical pipe line 253 for connecting the nozzle 251 with the part 252, a filter 255, a temperature controller 256 and an open/close valve 257 (see FIGS. 15, 16 and 17). The chemical supply part 252 comprises a chemical source 258, a chemical tank 252a for storing a new chemical liquid supplied from the source 258 and a circulation tank 252b for storing the processed chemical. Connected with both of the tanks 252a, 252b is a first drain pipe 242 which is also connected with a first drain port 241 at the lower part on the expanded side of the inner cylinder 225. The first drain pipe 242 is connected to a circulation pipeline 290 through a switching valve (not shown). The inner cylinder 225 has a first exhaust port 243 formed at the upper part on the expanded side of the cylinder 225. The first exhaust port 243 is connected with a first exhaust pipe 244 including an open/close valve (not shown). Temperature-control heaters 252c are arranged around the supply tanks 252a, 252b to maintain the chemical liquids in the tanks 252a, 252b at designated temperatures.

In order to supply all the wafers W of the plural number (e.g. 25 pcs.) carried in the rotor 221 with the chemical liquid uniformly, the chemical nozzle 251 is shaped in the form of a "shower" nozzle having twenty-six orifices (not shown) positioned outside the outermost wafers W and also disposed between the adjoining wafers W. Each orifice of the nozzle 251 ejects the chemical liquid in a generally fan-shaped pattern. Accordingly, when supplying the chemical liquid to the wafers W rotating together with the rotor 221 via the orifices of the nozzle 251, it is possible to supply the wafers W of the plural number (e.g. 25 pcs.) with the chemical liquid uniformly.

As shown in FIG. 17, the supply unit 260 for the chemical solvent (e.g. IPA) includes the nozzle 251 also serving as the above-mentioned chemical nozzle attached to the inner cylinder 225, a solvent supply part 261, a pump 254A interposed in an IPA pipeline 262 connecting the nozzle 251 with the chemical supply part 252, a filter 255A and an IPA supply valve 263. Note, the above nozzle 251 will be represented by "the chemical nozzle 251", hereinafter. The solvent supply part 261 is formed by a solvent (e.g. IPA) source 264, an IPA supply tank 261a for storing a new IPA liquid supplied from the IPA source 264 and a circulation supply tank 261b for storing the IPA liquid used in the process. A circulation pipeline 290 is connected with both of the IPA supply tanks 261a, 261b through not-shown switching valves. The circulation pipeline 290 is also connected to the first drain pipe 242 associated with the first drain port 241 in the lower part of the expanded side of the inner cylinder 225.

As shown in FIGS. 15, 16 and 17, the rinse supply unit 270 for a rinsing liquid (e.g. pure water) includes a pure water nozzle 271 attached to the second vertical wall 238, a pure water source 272, a supply pump 274 and a pure water supply valve 275 both of which are arranged in a pure water pipe line 273 connecting the nozzle 271 with the source 272. The pure-water nozzle 271 is positioned outside the inner cylinder 225 and also positioned inside the outer cylinder 226. When the inner cylinder 225 retreats to the standby position and the outer cylinder 226 moves to the position to surround the rotor 221 and the wafers W to define the outer chamber 224, then the nozzle 271 is positioned in the outer chamber 224 to supply the wafers W with the pure water.

The processing chamber 224 is provided, on its lower part of the expanded side, with a second drain port 245. The second drain port 245 is connected to a second drain pipe 246 through a not-shown open/close valve. In the second drain pipe 246, a resistivity meter 247 is interposed to detect the resistivity of pure water. On detection of the resistivity of pure water for the rinsing process, the resistivity meter 247 further outputs a signal to the CPU 230. Since the resistivity meter 247 monitors the present rinsing situation, it is possible to accomplish the appropriate rinsing process.

In the upper part on the expanded side of the outer cylinder 226, there is provided a second exhaust port 248 which is connected to a second exhaust pipe 249 having a not-shown open/close valve interposed therein.

As shown in FIGS. 15, 16 and 17, the dry fluid supply unit 280 includes a dry fluid nozzle 821 fixed on the second vertical wall 238, a dry fluid (e.g. $N_2$) source 282, an open/close valve 284 interposed in a dry fluid pipeline 283 communicating the nozzle 281 with the source 282, a filter 285 and a $N_2$-temperature controller 286. On the downstream side of the controller 286, the pipeline 283 is also connected with a branch pipeline 288 through a switching valve 287. The branch pipeline 288 is diverged from the IPA pipeline 262. As similar to the pure water nozzle 271, the dry fluid nozzle 281 is positioned outside the inner cylinder 225 and also inside the outer cylinder 226 both in the processing positions. With the withdrawal of the inner cylinder 225 to the standby position, when the outer cylinder 226 moves to the position to surround the rotor 21 and the wafers W to define the processing chamber 224, the dry fluid nozzle 281 is positioned in the outer chamber 224 to supply the wafers W with the mixture of $N_2$-gas and IPA in mist. After finishing drying the wafers W by the mixture of $N_2$-gas and IPA, the dry fluid nozzle 281 may be dried by the supply of only $N_2$-gas. In the modification, the mixture of $N_2$-gas and IPA may be replaced with only $N_2$-gas.

In chemical supply unit 250, the IPA supply unit 260, the pure water supply unit 270 and the dry fluid supply unit 280, the pumps 254, 254A, the temperature controller 256, the $N_2$ temperature controller 286, the open/close valve 257, the IPA supply valve 263 and the switching valve 287 are controlled by the CPU 230 (see FIG. 15), which is similar to the second embodiment.

Note, the above-constructed processing device 220 is arranged in a processing chamber provided, on its upper part, with a filter unit (not shown), so that cleaned air is always flowing downward toward the device 220.

Next, we describe the operation of the cleaning/drying apparatus in accordance. First, it is carried out to transport the carrier C to the carrier table 207 by the carrier-transporting unit 208. In the carrier C, there are accommodated the unprocessed wafers W which have been loaded into the carrier loading section 201 of the in/out port 200. Next, the wafer transporting chuck 210 is driven above the carrier table 207 to unload the wafers W out of the carrier C and successively transfer the delivered wafers W to the upside of the processing device 220 in the cleaning unit 203, in other words, the upside of the rotor 221. Then, the inner cylinder 225 and the outer cylinder 226 are withdrawn to the standby position.

Next, the wafer delivery hand 229 is elevated to receive the wafers W which have been transported by the wafer transporting chuck 210. Upon receipt of the wafers W, the hand 229 is lowered to deliver the wafers W onto the immovable rods 231 on the rotor 221. Thereafter, the hand 229 returns to the initial position. After completing to deliver the wafers W onto the rods 231, the movable rods 232 are driven to hold the upper parts of the wafers W. In this way, the wafers W are accommodated in the rotor 221.

Next, the inner cylinder 225 and the outer cylinder 226 are moved to the positions to surround the rotor 211 and the wafers W, so that the wafers W are accommodated in the processing chamber 223. In this condition, it is carried out to supply the wafers W with the chemical liquid in the chemical-processing process.

Figure 10:
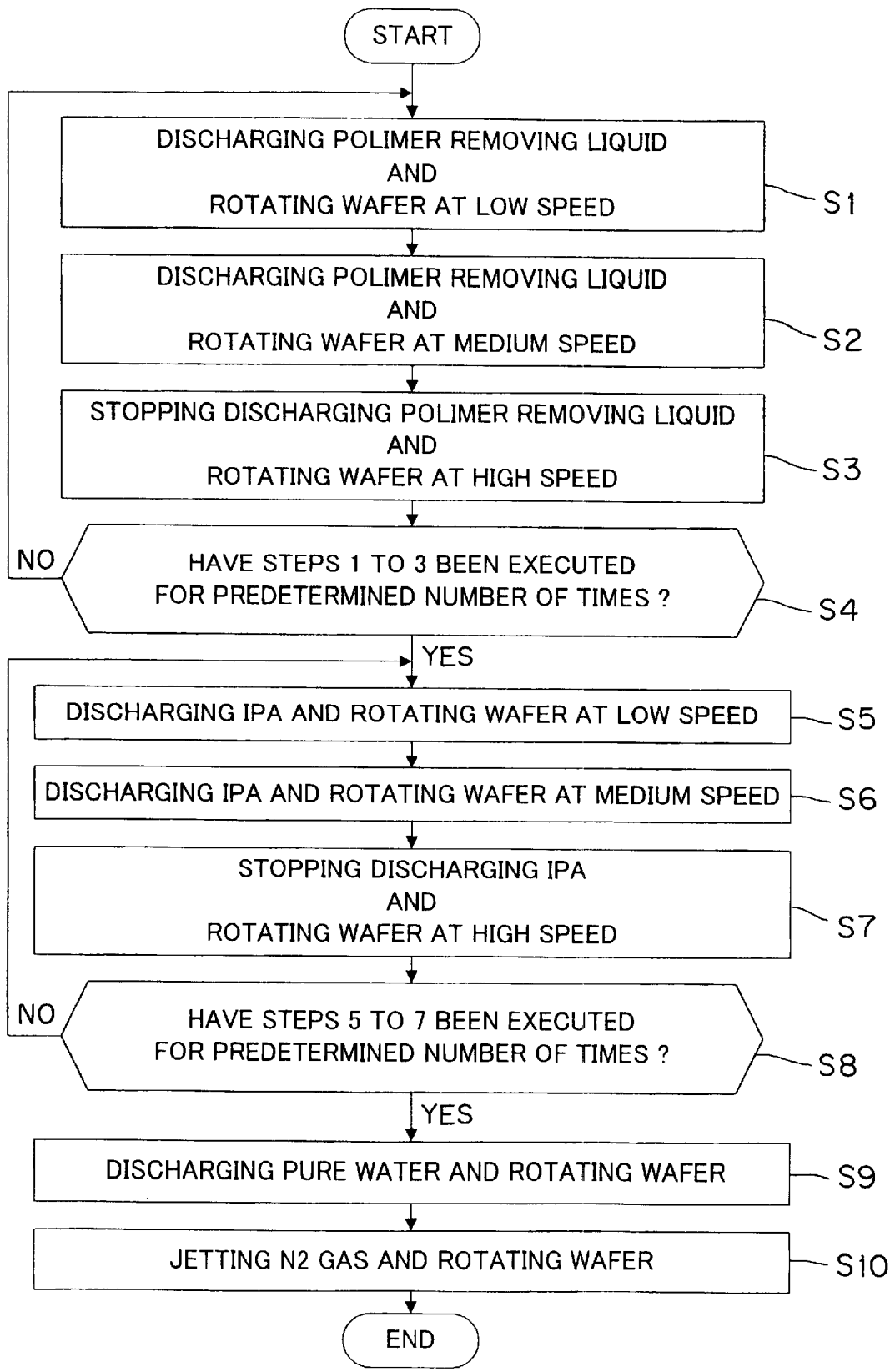
FIG. 10 is a flow chart showing a series of steps of the cleaning process of the invention.
Figure 11:
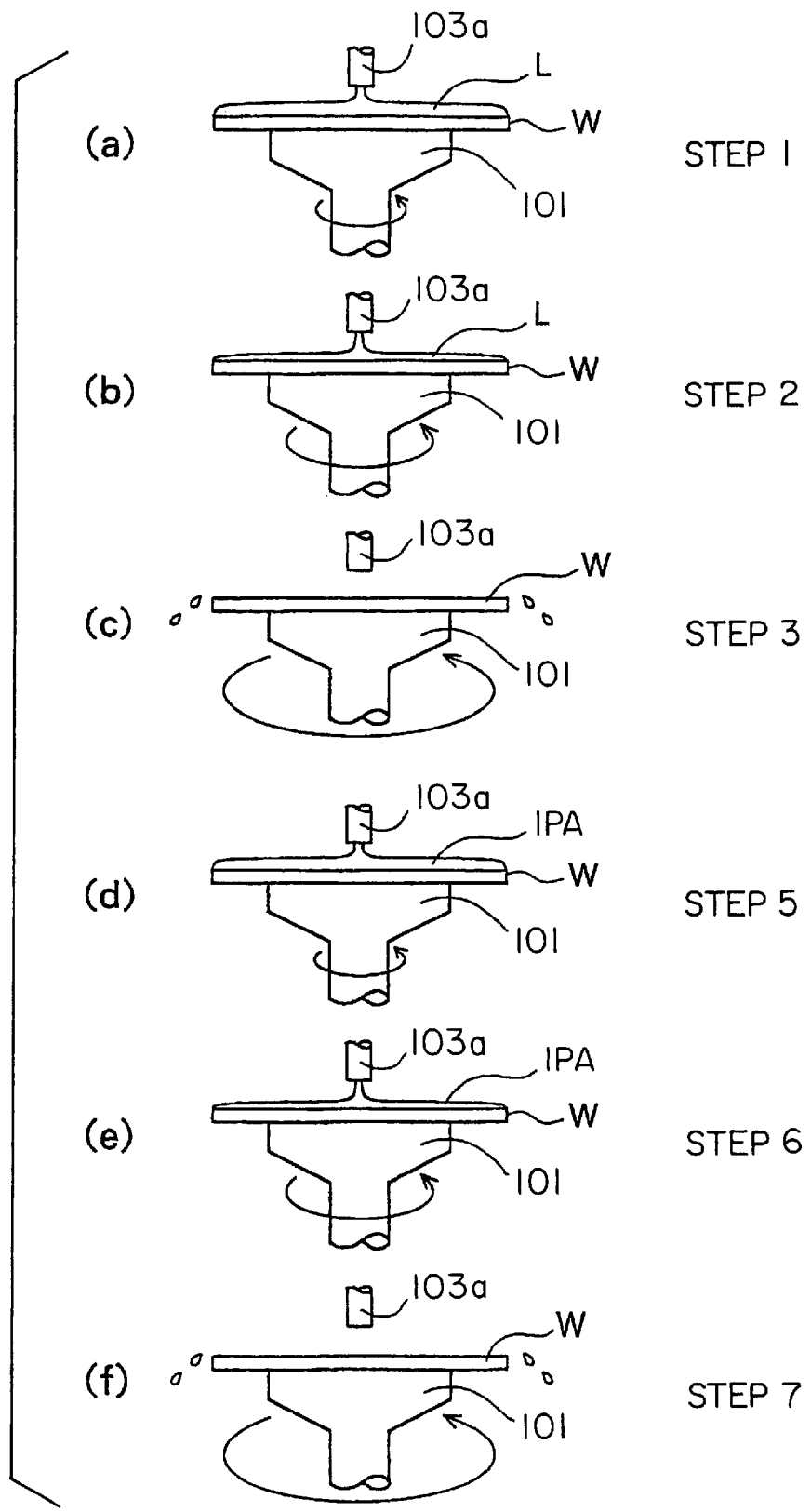
FIG. 11 is a process diagram showing the steps of the cleaning process.
Figure 12:
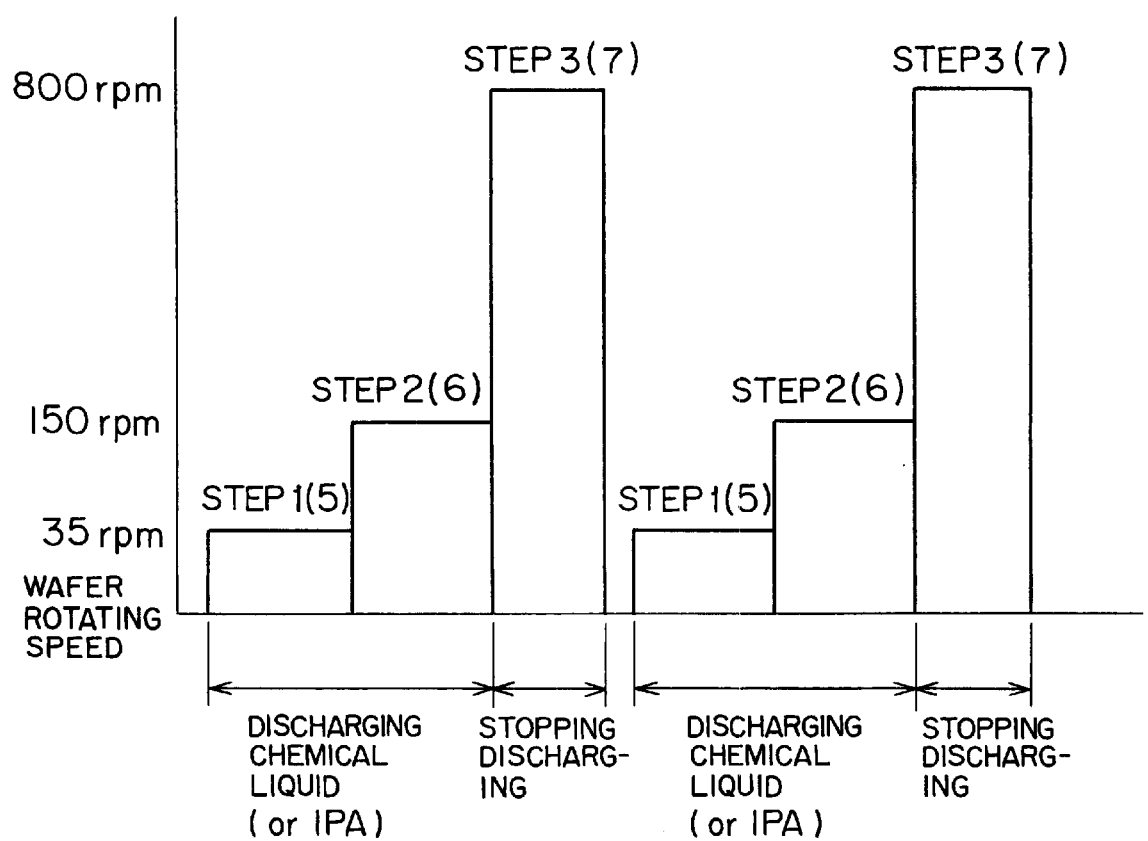
FIG. 12 is a graph showing a relationship between revolutions of the wafer and ejecting conditions of the chemical liquid in the cleaning process.

This chemical-processing process is carried out in accordance with the same steps as those of the second embodiment (steps 1 to 3 of FIG. 10). At each step, both revolutions and duration period of the rotor 221 may be respectively equal to those of the spin chuck at each step of the second embodiment. In the steps 1 to 3 to be repeated by several times (hundreds to thousands of times), it is executed to use the chemical liquid stored in the circulation tank 252b at steps 1 and 2. Then, this chemical liquid on the first use is thrown away through the first drain pipe 242. On and after the next process, the chemical liquid stored in the circulation tank 252b is supplied for circulation. At steps 1 and 2 executed at the end of the chemical-processing process, a new chemical liquid supplied from the chemical source 58 into the chemical tank 252a is used.

During this chemical-processing process, the chemical liquid provided for the chemical-processing process is discharged to the first drain port 241 and further discharged into the circulating pipe line 290 of the chemical supply part 252 or the first drain pipe 242 by the switching operation of a switching valve (not shown). On the other hand, the gas generated from the chemical liquid is discharged from the first exhaust pipe 244 through the first exhaust port 243.

After repeating the operations of steps 1 to 3 by several times (step 4), it is started to supply the wafers W with the IPA liquid for the chemical removing process. This chemical removal process is carried out in accordance with the same steps as those of the second embodiment (steps 5 to 7 of FIG. 10). At each step, both revolutions and duration period of the rotor 221 may be respectively equal to those of the spin chuck at each step of the second embodiment. The IPA liquid is supplied from the chemical nozzle 251 also serving as the IPA nozzle in the IPA supply unit 260.

As similar to the above chemical-processing process, in steps 5 to 7 to be repeated by several times, it is executed to use the IPA liquid stored in the circulation tank 261b at steps 5 and 6. Then, this IPA liquid on the first use is thrown away through the first drain pipe 242. On and after the next process, the IPA liquid stored in the circulation tank 261b is supplied for circulation. At steps 5 and 6 executed at the end of the chemical removal process, a new IPA liquid supplied from the IPA source 264 into the tank 261a is used.

During this chemical removal process, the IPA liquid provided for the removal process is discharged to the first drain port 241 and further discharged into the circulating pipe line 290 of the solvent supply part 261 or the first drain pipe 242 by the switching operation of a switching valve (not shown). On the other hand, the IPA gas is discharged from the first exhaust pipe 244 through the first exhaust port 243.

After completing the chemical removal process as a result of the repetition of steps 5 to 7 by several times (hundreds to thousands of times), the inner cylinder 225 is withdrawn to the standby position, so that the rotor 221 and the wafers W are surrounded by the outer cylinder 226. In other words, the wafers W are accommodated in the processing chamber 224. In this state, the rinsing liquid (e.g. pure water) is supplied to the rotating wafers W through the pure-water nozzle 271 of the rinse supply unit (step 9). When executing step 9, it is preferable to supply $CO_2$ gas in the processing chamber 224. That is, when executing step 9, the technique mentioned in the description of the first embodiment of the present invention. The pure water provided for the rinsing process and the so-removed IPA component are together discharged from the second drain pipe 246 via the second drain port 245. Further, the gas produced in the outer chamber 224 is discharged out of the second exhaust pipe 249 through the second exhaust port 248. Also in the pure-water rinsing process, as similar to the chemical-processing process and the chemical removal process, there may be repeatedly carried out the following steps: (1) to supply the pure water/rotate wafers at low speed; (2) to supply the pure water/rotate wafers at middle speed; and (2) to stop the supply of pure water/rotate wafers at high speed, in that order, by several times.

After carrying out the rinsing process for a predetermined period, it is executed to supply the rotating wafers W with the mixed fluid of $N_2$-gas from the $N_2$-gas source 282 and IPA from the IPA source 264 on condition of accommodating the wafers W in the processing chamber 224. In this way, the pure water sticking to the wafers' surfaces can be removed to dry the wafers W (step 10). Simultaneously, the outer cylinder 226 can be dried. Additionally, if the wafers W is supplied with only $N_2$-gas continuously to the above drying process using the mixture of $N_2$-gas and IPA, then the drying of the wafers W and the outer chamber 24 can be progressed more effectively.

After completing the chemical-processing process, the chemical removal process, the rinsing process and the drying process, it is executed to withdraw the outer cylinder 226 to the standby position in the circumference of the inner cylinder 225. While, the movable rods 232 of the rotor 221 are moved to their releasing positions (not shown). Next, the wafer delivery hand 229 is elevated to receive the wafers W held by the immovable rods 231 and thereafter, the hand 229 is moved to the upside of the processing device 220. The wafers W brought into the upside of the processing device 220 are then received by the wafer transporting chuck 210. The wafer transporting chuck 210 transport the wafers W to the interface section 204 and further load them into the carrier C on the carrier table 207. Thereafter, the carrier C retaining the processed wafers W is transported to the carrier unloading section 202 by the carrier transporting unit 208. Finally, the wafers W are discharged outside the apparatus.

It should be noted that the object(s) to be processed by the present processing apparatus are semiconductor wafers in common with the first embodiment to the third embodiment. Nevertheless, with no limitation to these embodiments, the invention is applicable for processing other objects, for example, glass substrates for liquid crystal display (LCD) units.

What is claimed is:

1. A method of cleaning a substrate in a processing chamber, comprising the steps of:
    (a) introducing carbon dioxide gas into the processing chamber, thereby making an atmosphere of carbon dioxide concentration being greater than that in air in the processing chamber; and
    (b) spraying the substrate with pure water while rotating the substrate in the processing chamber having the atmosphere of carbon dioxide.

2. The method according to claim 1, further comprising the step of:
    (c) spraying an environment of the substrate with pure water in a form of mist before the beginning of the spraying step (b), thereby dissolving the carbon dioxide gas into the pure water in the form of mist.

3. The method according to claim 1, further comprising the step of:
    (c) spraying an environment of the substrate with steam of pure water before the beginning of the spraying step (b), thereby dissolving the carbon dioxide gas into the steam of the pure water.

4. The method according to claim 1, wherein, at the spraying step (b), the supply of pure water is stopped at least once and subsequently, the supply of pure water is resumed.

5. The method according to claim 1, wherein concentration of the carbon dioxide gas in the processing chamber at the introducing step (a) is more than 20 volume %.

6. The method according to claim 1, further comprising the step of:
    (c) removing substances sticking to the substrate by a chemical liquid of organic amine type before the introducing step (a) and the spraying step (b).

* * * * *